(12) United States Patent
Hori

(10) Patent No.: US 7,924,068 B2
(45) Date of Patent: Apr. 12, 2011

(54) AUTOMATIC ADJUSTMENT CIRCUIT, AND FILTER CIRCUIT

(75) Inventor: Shinichi Hori, Tokyo (JP)

(73) Assignee: NEC Corporation, Tokyo (JP)

( * ) Notice: Subject to any disclaimer, the term of this patent is extended or adjusted under 35 U.S.C. 154(b) by 171 days.

(21) Appl. No.: 12/085,230

(22) PCT Filed: Oct. 10, 2006

(86) PCT No.: PCT/JP2006/320185
§ 371 (c)(1),
(2), (4) Date: May 20, 2008

(87) PCT Pub. No.: WO2007/063643
PCT Pub. Date: Jun. 7, 2007

(65) Prior Publication Data
US 2009/0167372 A1 Jul. 2, 2009

(30) Foreign Application Priority Data
Nov. 29, 2005 (JP) ................. 2005-343921

(51) Int. Cl.
H03B 19/00 (2006.01)
(52) U.S. Cl. ........................................ 327/113; 327/554
(58) Field of Classification Search ............. 327/113, 327/551–554
See application file for complete search history.

(56) References Cited

U.S. PATENT DOCUMENTS

| | | | | |
|---|---|---|---|---|
| 5,179,727 A | * | 1/1993 | Imagawa | 455/182.3 |
| 7,051,063 B2 | * | 5/2006 | Kaczynski et al. | 708/819 |

FOREIGN PATENT DOCUMENTS

| | | |
|---|---|---|
| JP | 3-173217 | 7/1991 |
| JP | 5-291946 | 11/1993 |
| JP | 5-299971 | 11/1993 |
| JP | 6-209231 | 7/1994 |
| JP | 6-315024 | 11/1994 |
| JP | 7-50555 | 2/1995 |
| JP | 9-98446 | 4/1997 |
| JP | 10-322162 | 12/1998 |
| JP | 11-186875 | 7/1999 |
| JP | 2000-82937 | 3/2000 |
| JP | 2002-76842 | 3/2002 |
| JP | 2002-111445 | 4/2002 |
| JP | 2003-60485 | 2/2003 |
| JP | 2003-188683 | 7/2003 |
| JP | 2003-347901 | 12/2003 |
| JP | 2004-227731 | 8/2004 |

* cited by examiner

Primary Examiner — Lincoln Donovan
Assistant Examiner — Diana J Cheng
(74) Attorney, Agent, or Firm — McGinn IP Law Group, PLLC

(57) ABSTRACT

An automatic adjustment circuit comprises a replica (1) constituted of either a circuit block of a portion of a filter body (3) or a combination of the circuit block, and fed with a reference signal (2) from the outside, for outputting signals having a phase delays of 90 degrees and 180 degrees with respect to the reference signal (2), and an integrating comparator (4) fed at its input terminal with an output signal, as having a phase delay of 180 degrees, of the replica (1) and the reference signal (2), and at its clock terminal with an output signal, as having a phase delay of 90 degrees, of the replica (1), and having an output terminal connected with a capacity (C1) and a frequency characteristic adjusting terminal of the replica (1). The automatic adjusting circuit is characterized in that the integrating action of the integrating comparator (4) is performed across the two high/low states of the input signal.

14 Claims, 14 Drawing Sheets difference of frequency characteristic due to process variations

AUTOMATIC ADJUSTMENT CIRCUIT, AND FILTER CIRCUIT

TECHNICAL FIELD

The present invention relates to an automatic adjustment circuit for automatically adjusting frequency characteristics to target characteristics, and more particularly to an automatic adjustment circuit which is highly accurate and capable of high-speed operation.

BACKGROUND ART

With the development of the process technology in recent years, it has become possible to fabricate a high-functionality device, typified by a wireless device, made up of a variety of interconnected circuit blocks, as a one-chip IC (Integrated Circuit).

A filter circuit, which is a circuit block of a radio device, serves to remove signals in unwanted frequency bands. Therefore, the filter circuit is required to have frequency characteristics that are higher in accuracy than the other circuit blocks of the radio device. Usually, the filter circuit incorporates an automatic adjustment circuit for adjusting the difference between designed values and actual frequency characteristics due to fabrication process variations.

One most general means for use as the automatic adjustment circuit of a filter circuit employs a replica made up of a portion of a circuit block of a main filter unit. The replica and the main filter unit are positioned in close proximity with each other on the chip layout for thereby equalizing changes in the frequency characteristic of the replica and the main filter unit due to device variations in the fabrication process. The frequency characteristic of the replica is adjusted, and an adjustment signal applied to the frequency characteristic adjusting terminal of the replica is also applied to the frequency characteristic adjusting terminal of the main filter unit, making it possible to adjust the frequency characteristic of the main filter unit.

FIG. 1 shows, as an example of the frequency characteristic of a general filter, the frequency characteristic of the gain of a second-order BPF (Band-Pass Filter) and the frequency characteristic of the phase thereof.

The frequency characteristics of the gain and the phase are mapped onto each other such that when one of the frequency characteristics is determined, the other frequency characteristic is also determined. If the actual frequency characteristics deviate from design values due to fabrication process variations, then the frequency characteristics of the gain and the phase vary at equal rates, as indicated by the broken lines in FIG. 1. This means that when one of the frequency characteristics of the gain and the phase is adjusted, the other frequency characteristic is also adjusted.

FIG. 2 is a circuit diagram of an automatic adjustment circuit according to the background art.

Replica 9 is made up of a portion of a circuit block of main filter unit 10. Main filter unit 10 and replica 9 have respective frequency characteristic adjusting terminals, and can simultaneously be adjusted. Phase comparator 12 is fed with reference signal 11 and an output signal from replica 9 which is fed with reference signal 11, and outputs an error signal depending on the difference between the phase difference between the input signals and a design value. The error signal is applied to the frequency characteristic adjusting terminal of replica 9 to correct the circuit operation in a direction to make the error signal nil. The circuit operation is finally stabilized when the frequency characteristics of replica 9 and main filter unit 10 are equalized to the design value. The frequency characteristics of replica 9 and main filter unit 10 are thus adjusted to the design value (see Patent documents 1, 2, for example).

In the automatic adjustment circuit according to the background art, as described above, the accuracy with which to adjust the frequency characteristics of the main filter unit depends largely on the phase comparator. In order to increase the accuracy of the phase comparator, the contribution of a parasitic phase delay has to be applied equally to the reference signal and the output signal of the replica.

Consequently, the phase comparator has to be configured fully symmetrically with respect to the reference signal and the output signal of the replica. However, no full symmetry can be achieved by simple configurations of the background art (a double-balanced-mixer phase comparator, a phase comparator employing logic circuits, etc.). If the phase comparator is larger in scale, then the parasitic phase delay increases, making it difficult for the phase comparator to operate at a high speed, and inviting an increase in the chip area and the power consumption.

For the reasons described above, the automatic adjustment circuit according to the background art is problematic in that it is difficult to increase the accuracy with which to adjust the frequency characteristics of the filter circuit.

Patent document 1: JP-A No. 05-299971
Patent document 2: JP-A No. 2003-347901

DISCLOSURE OF THE INVENTION

The task to be achieved by the present invention is to solve the above problems of the background art. It is an object of the present invention to provide an automatic adjustment circuit and a filter circuit which occupy a small chip area, has a low power consumption level, and is highly accurate and capable of high-speed operation.

To achieve the above object, there is provided in accordance with the present invention an automatic adjustment circuit for automatically adjusting the frequency characteristics of a filter circuit, comprising:

(a) a replica for being supplied with a reference signal from an external source, the replica being made of a circuit block of a main filter unit or a combination of circuit blocks thereof; and (b) an integrating circuit for being supplied with a reference signal or signals output from the replica, as input signals, and also supplied with the reference signal or a signal output from the replica, as a clock signal, performing an integrating operation in synchronism with the clock signal, and applying an output signal to frequency characteristic adjusting terminals of the replica and the main filter unit;

(c) the clock signal and the input signal which are input to the integrating circuit have a phase difference of 90 degrees.

As described above, one of the input signals and the clock signal supplied to the integrating circuit are given as a combination of a reference signal and an output signal from the replica which has a phase difference of 90 degrees with respect to the reference signal. The integrating circuit can thus integrate the input signal in a time domain including the instant of a changeover between high and low levels.

With the above arrangement, phase offset errors produced at the instant of the changeover between high and low levels of a plurality of input signals cancel out each other, increasing the accuracy for phase comparison.

The integrating circuit allows paths for outputting the respective input signals to be designed with high symmetry, for thereby minimizing a parasitic phase delay caused by circuit asymmetry.

For the above reasons, according to the present invention, the automatic adjustment circuit is capable of adjusting frequency characteristics with high accuracy and also of high-speed operation.

BEST MODE FOR CARRYING OUT THE INVENTION

1st Exemplary Embodiment

Figure 3:
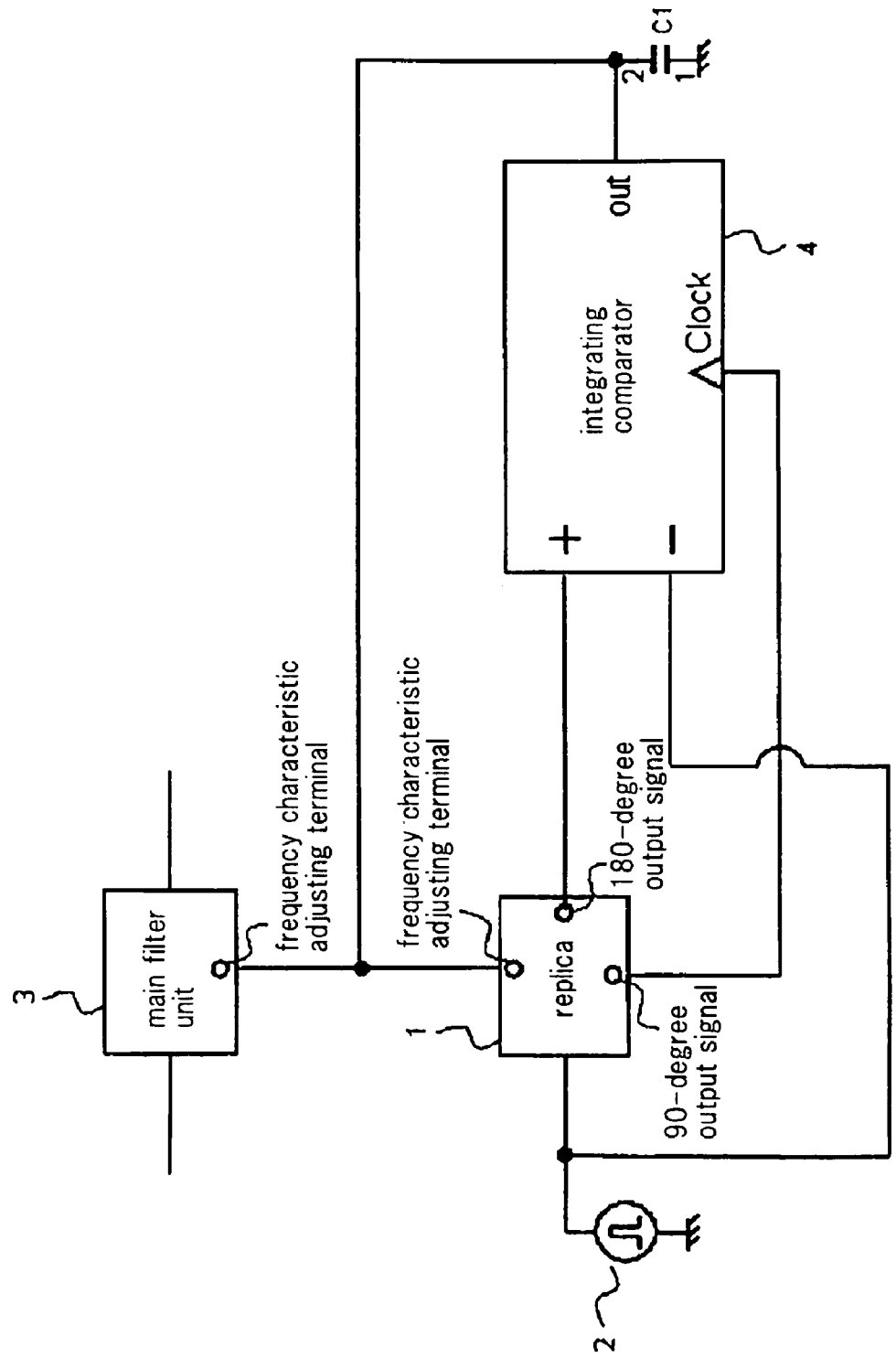
FIG. 3 is a circuit diagram of an automatic adjustment circuit according to a first exemplary embodiment of the present invention.

FIG. 3 is a diagram of an automatic adjustment circuit according to a first exemplary embodiment of the present invention. The automatic adjustment circuit is incorporated in a filter circuit.

In FIG. 3, 3 denotes a main filter unit and 1 a replica made up of a portion of a circuit block of main filter unit 3. Main filter unit 3 and replica 1 have respective frequency characteristic adjusting terminals. As a voltage applied to the frequency characteristic adjusting terminals goes higher, the frequency is adjusted to be higher. The frequency characteristic adjusting terminals of replica 1 and main filter unit 3 are connected to each other, and replica 1 and main filter unit 3 have respective frequency characteristics simultaneously adjusted to an optimum state. Replica 1 outputs a 180-degree output signal and a 90-degree output signal that are delayed in phase by 180 degrees and 90 degrees, respectively, from reference signal 2 input to replica 1. Integrating comparator 4 has a positive terminal, a negative terminal, a clock terminal, and an output terminal which are connected respectively to the 180-degree output signal, the reference signal, the 90-degree output signal, and the frequency characteristic adjusting terminals of replica 1 and main filter unit 3. Capacitor C1 is connected between the output terminal of integrating comparator 4 and ground.

If main filter unit 3 is a gm-C filter comprising a combination of gm amplifiers as voltage-to-current converting devices and capacitors, then replica 1 is made up of a combination of gm amplifiers which have the same circuit topology as main filter unit 3 and capacitors. As described later, replica 1 is a second-order biquad circuit for producing an output signal according to a second-order transfer function with respect to an input signal.

Figure 4:
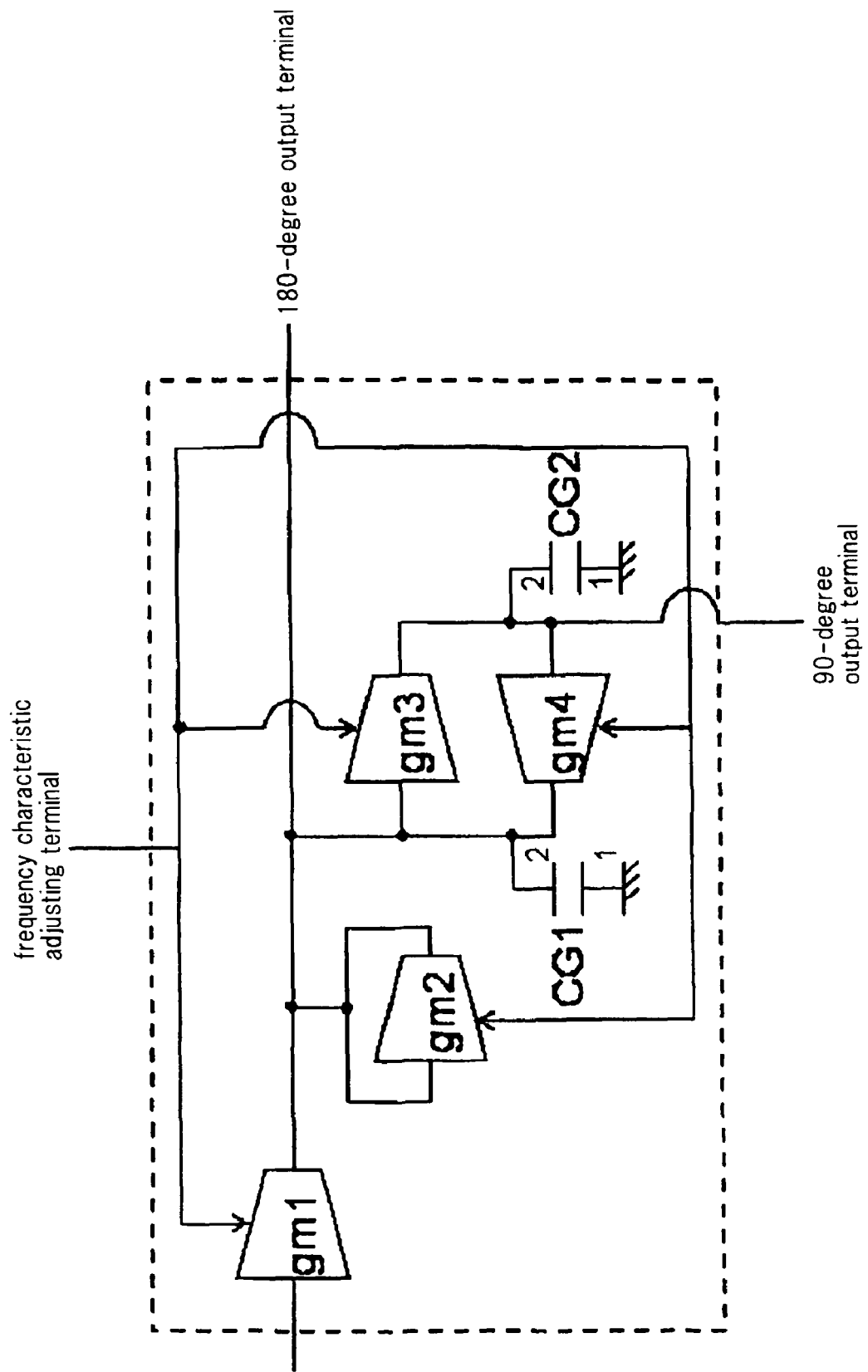
FIG. 4 is a circuit diagram showing an example of a replica which is included in the first exemplary embodiment of the present invention.

FIG. 4 shows an example of the configuration of replica 1.

In FIG. 4, gm1, gm2, gm3, and gm4 denote gm amplifiers which are designed according to the same circuit topology as the gm amplifiers of main filter unit 3, and CG1, CG2 denote capacitors. Replica 1 has an input terminal connected therein to the input terminal of gm1. The 180-degree output terminal of replica 1 is connected to the output terminal of gm1, the input and output terminals of gm2, the output terminal of gm3, the output terminal of gm4, and terminal 2 of CG1 having terminal 1 grounded, in parallel relation to each other. The 90-degree output terminal of replica 1 is connected to the output terminal of gm3, the input terminal of gm4, and terminal 2 of CG2 having terminal 1 grounded, in parallel relation to each other. The frequency characteristic adjusting terminal of replica 1 is connected to the gm value adjusting terminals of the respective gm amplifiers in parallel relation to each other. The gm value adjusting terminals adjust the gm values depending on a voltage input thereto. When the same voltage is applied to the gm value adjusting terminals of the gm amplifiers which are thus connected, all the gm values can be varied at equal rates.

It is assumed that the gm values of gm1, gm2, gm3, and gm4 are represented by $-g_1, -g_2, -g_3, -g_4$, respectively, and the capacitance values of CG1, CG2 by $C_1, C_2$, respectively. Transfer functions $F_{180}(s)$, $F_{90}(s)$ of the 180-degree output signal and the 90-degree output signal with respect to the input signal are expressed respectively by the following equations 1, 2:

$$F_{180}(s) = \frac{-s\frac{g_1}{C_1}}{s^2 + \frac{g_2}{C_1}s + \frac{g_3 \cdot g_4}{C_1 \cdot C_2}} \quad \text{[Equation 1]}$$

$$F_{90}(s) = \frac{\frac{g_1 \cdot g_3}{C_1 \cdot C_2}}{s^2 + \frac{g_2}{C_1}s + \frac{g_3 \cdot g_4}{C_1 \cdot C_2}} \quad \text{[Equation 2]}$$

The equations 1, 2 indicate the respective phase delays of 180 and 90 degrees which are caused on the input signal whose angular frequency $\omega_0$ is represented by the value of the next equation 3.

$$\omega_0 = \sqrt{\frac{g_3 \cdot g_4}{C_1 \cdot C_2}}$$ [Equation 3]

The frequency of reference signal 2 is set to $\omega_0/2\pi$. Therefore, the 180-degree output signal and the 90-degree output signal of replica 1 are designed to have respective phase delays of 180 and 90 degrees with respect to reference signal 2.

The adjustment of the frequency characteristic of replica 1 with an adjustment signal that is applied to the frequency characteristic adjusting terminal will be described below. When an adjustment signal is applied to the frequency characteristic adjusting terminal, all gm values vary at equal rates. If the rate of change of the gm values is indicated by $\beta$, then the transfer functions and $\omega_0$ are expressed according to the following equations 4, 5, and 6:

$$F_{\beta 180}(s) = \frac{-\left(\frac{s}{\beta}\right) \cdot \frac{g_1}{C_1}}{\left(\frac{s}{\beta}\right)^2 + \frac{g_2}{C_1} \cdot \left(\frac{s}{\beta}\right) + \frac{g_3 \cdot g_4}{C_1 \cdot C_2}}$$ [Equation 4]

$$F_{\beta 90}(s) = \frac{\frac{g_1 \cdot g_3}{C_1 \cdot C_2}}{\left(\frac{s}{\beta}\right)^2 + \frac{g_2}{C_1} \cdot \left(\frac{s}{\beta}\right) + \frac{g_3 \cdot g_4}{C_1 \cdot C_2}}$$ [Equation 5]

$$\omega_{\beta 0} = \beta \cdot \sqrt{\frac{g_3 \cdot g_4}{C_1 \cdot C_2}}$$ [Equation 6]

The equations 4, 5, 6 mean that the frequency characteristics are scaled $\beta$ times. Therefore, it has been indicated that the frequency characteristic adjusting terminal of replica 1 is capable of adjusting the frequency characteristics of replica 1.

Integrating comparator 4 is fed with the 180-degree output signal of replica 1 as an input signal input to the positive terminal, reference signal 2 as an input signal input to the negative terminal, and the 90-degree output signal of replica 1 as a clock signal. When the clock signal is high in level, integrating comparator 4 samples both the input signals and determines integral values thereof. When the clock signal goes low in level, integrating comparator 4 compares the integral values. If the integral value of the input signal input to the positive terminal is higher than the integral value of the input signal input to the negative terminal, then integrating comparator 4 outputs a current in a discharging direction. Conversely, if the integral value of the input signal input to the positive terminal is lower than the integral value of the input signal input to the negative terminal, then integrating comparator 4 outputs a current in a drawing direction.

Figure 5:
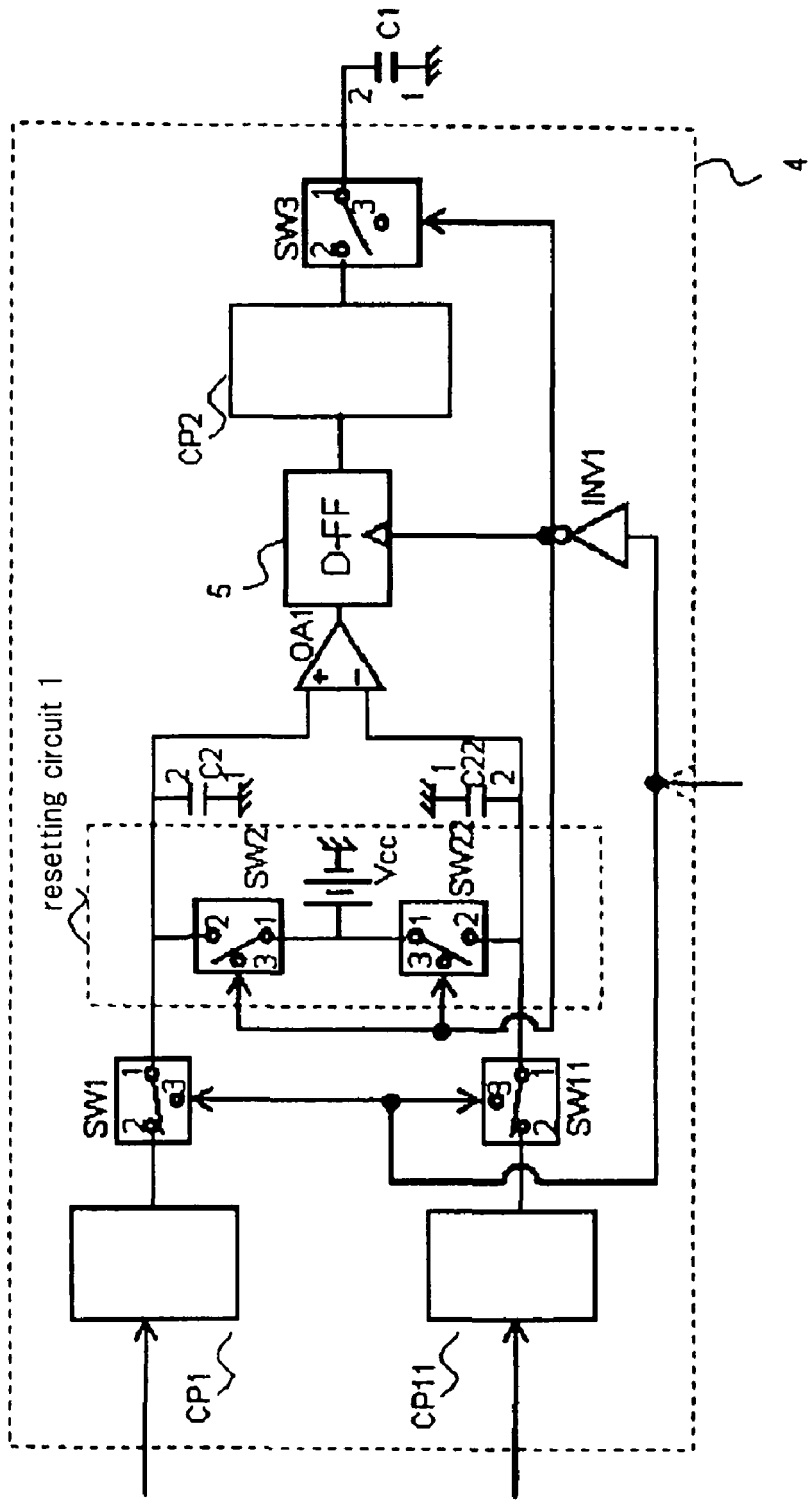
FIG. 5 is a circuit diagram showing a first example of an integrating comparator which is included in the first exemplary embodiment of the present invention.

FIG. 5 shows an example of the configuration of integrating comparator 4.

CP1, CP11, CP2 denote charge pumps each for outputting a constant current in the discharging direction when the input signal is high in level, and outputting a constant current, which is of the same value as the current output in the discharging direction, in the drawing direction when the input signal is low in level. SW1, SW11, SW2, SW22, SW3 denote switch circuits each for connecting terminal 1 and terminal 2 to each other (ON state) when the input signal input to terminal 3 is high in level and opening between terminal 1 and terminal 2 (OFF state) when the input signal is low in level. INV1 denotes an inverting circuit for converting a high-level signal into a low-level signal and converting a low-level signal into a high-level signal. OA1 denotes a voltage comparing circuit for outputting a high-level signal when the voltage input to a positive terminal thereof is higher than the voltage input to a negative terminal thereof, and outputting a low-level signal when the voltage input to the positive terminal thereof is lower than the voltage input to the negative terminal thereof. D-FF5 denotes a flip-flop for outputting an input signal as an output signal the instant the clock signal changes from a low level to a high level, and holding the output signal until the clock signal changes from the low level to the high level next time. C2, C22 denote capacitors, and Vcc a constant power supply circuit. Vcc and SW2, SW2 make up resetting circuit 1. Vcc has a negative terminal connected to ground and a positive terminal connected to terminals 1 of SW2, SW22. Terminals 2 of SW1, SW11 are connected to the respective output terminals of CP1, CP11, and terminals 2 of SW2, SW22 in resetting circuit 1 are connected to respective terminals 1 of SW1, SW11. Terminals 1 of SW1, SW11 are connected to respective terminals 2 of capacitors C2, C22 whose terminals 1 are grounded, and also to the respective positive and negative terminals of OA1, in parallel relation to each other. The output terminal of OA1 is connected to the input terminal of D-FF5, whose output terminal is connected to the input terminal of CP2. The output terminal of CP2 is connected to terminal 2 of SW3, whose terminal 1 serves as the output terminal of integrating comparator 4 and is connected to terminal 2 of C1 in FIG. 3. The external clock signal is input to terminals 3 of SW1, SW11, and is also input through INV1 to terminals 3 of SW2, SW22, SW3 and the clock terminal of D-FF.

When the clock signal is high in level, integrating comparator 4 performs the following integrating operation: Since the high-level signal is applied to terminals 3 of SW1, SW11, SW1, SW11 are brought into the ON state. Therefore, output currents from CP1, CP11 are stored as electric charges in C2, C22. Since the low-level signal is applied to terminals 3 of SW2, SW22, SW2, SW22 are brought into the OFF state. As resetting circuit 1 is disconnected from terminals 2 of capacitors C2, C22 in this state, resetting circuit 1 does not affect the circuit operation of integrating comparator 4. The electric charges stored in C2, C22 are converted into respective voltage signals, which are compared in magnitude with each other by OA1. If the voltage across C2 is higher than the voltage across C22, then OA1 outputs a high-level signal, and if the voltage across C2 is lower than the voltage across C22, then OA1 outputs a low-level signal. As SW3 is in the OFF state, integrating comparator 4 outputs no current.

When the clock signal changes from the high level to the low level, integrating comparator 4 operates to output a current as follows: The input signal input to the clock terminal of D-FF5 that is connected to the output terminal of INV1 changes from a low level to a high level. The output signal of OA1 which is input to D-FF5 is transferred as the output signal of D-FF5. Depending on whether the output signal of D-FF5 is high or low in level, CP2 outputs a current in either the discharging direction or the drawing direction as the output signal of integrating comparator 4 through SW3 which is in the ON state. SW2, SW22 in resetting circuit 1 are brought into the ON state, setting the voltages at terminals 2 of C2, C22 to the voltage value of constant power supply Vcc.

When the clock signal changes from the low level to the high level, SW1, SW11 are brought into the ON state, starting to supply electric charges from CP1, CP2 to C2, C22 again. As SW3 is brought into the OFF state, the current from integrating comparator 4 is cut off.

Figure 6:
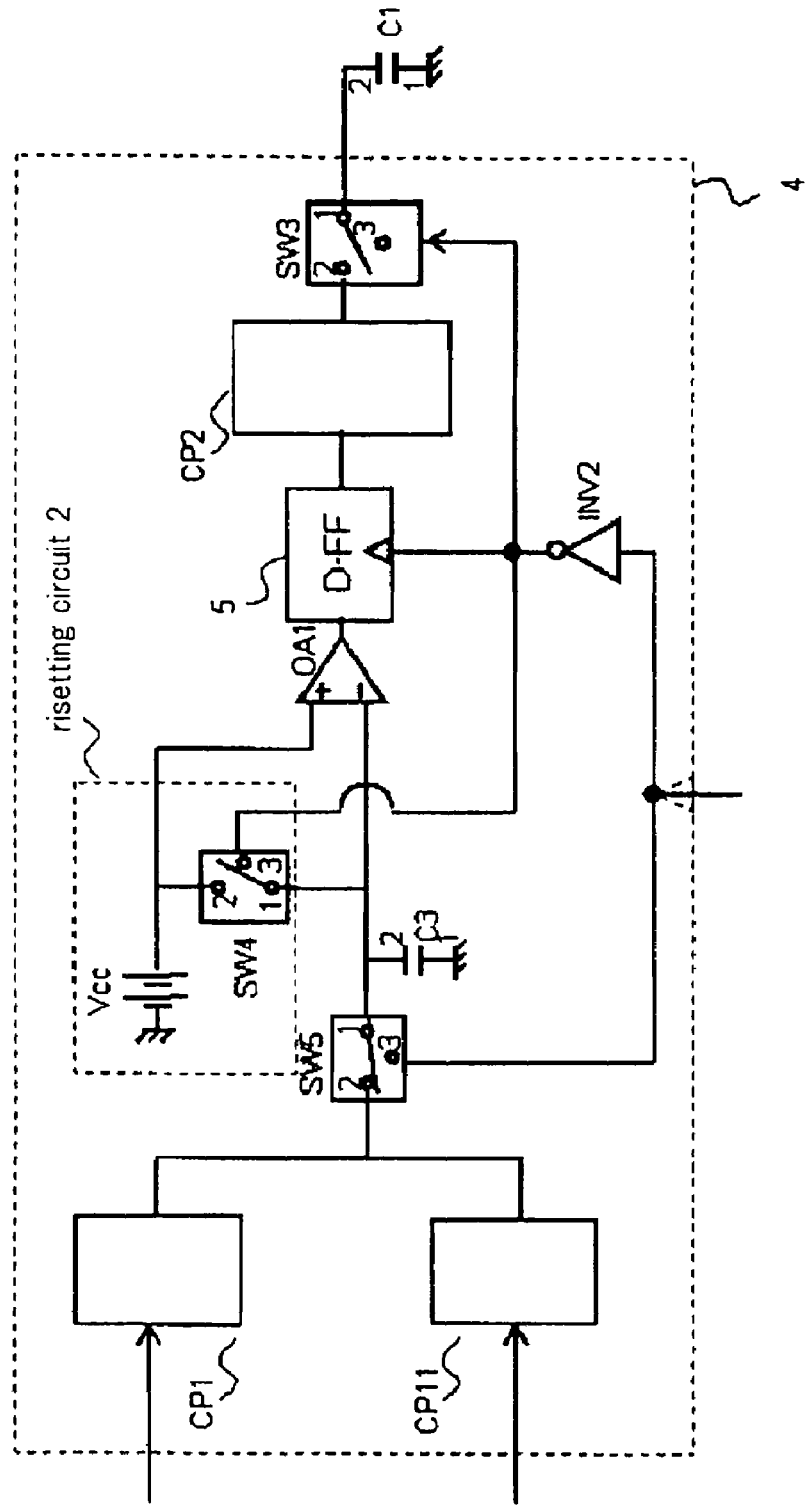
FIG. 6 is a circuit diagram showing a second example of an integrating comparator which is included in the first exemplary embodiment of the present invention.

FIG. 6 shows another example of the configuration of integrating comparator 4.

In FIG. 6, those devices and blocks which are identical to those shown in FIG. 3 are denoted by identical names and numbers. The output terminals of CP1, CP2 that are connected to the input terminals of integrating comparator 4 therein are connected to terminal 2 of switch circuit SW5. Terminal 1 of SW5 is connected to terminal 2 of capacitor C3 whose terminal 1 is grounded and the negative terminal of OA1 in parallel relation to each other. Resetting circuit 2 comprises switch circuit SW4 and Vcc. The positive terminal of Vcc is connected to terminal 2 of SW4 and the positive terminal of OA1 in parallel relation to each other. Terminal 1 of SW4 is connected to terminal 1 of SW5. The output terminal of OA1 is connected to the input terminal of D-FF5, whose output terminal is connected to the input terminal of CP2. The output terminal of CP2 is connected to terminal 2 of SW3, whose terminal 1 is connected to the output terminal of integrating comparator 4 therein. The external clock signal is input to terminal 3 of SW5 and the input terminal of inverting circuit INV2, whose output terminal is connected to terminal 3 of SW4, terminal 3 of SW3, and the clock terminal of D-FF5.

When the clock signal is low in level, since SW4 is in the ON state, the voltage at terminal 2 of C3 is set to the voltage value of voltage source Vcc. When the clock signal goes high in level, SW4 is brought into the OFF state and SW5 is brought into the ON state, storing output currents of CP1, CP2 as an electric charge in C3. If the input signal of CP1 is delayed in phase by 180 degrees from the input signal of CP2, then one of the input signals is high in level and the other low in level. Accordingly, as the currents supplied from CP1, CP2 to C3 cancel each other, and the electric charge newly stored in C3 is nil. According to the present exemplary embodiment, the clock signal is delayed in phase by nearly 90 degrees from the input signal of CP2 and the input signal of CP1 is delayed in phase by about 180 degrees from the input signal of CP2. Therefore, if the phase of the input signal of CP1 lags by more than 180 degrees, then the time in which the input signal of CP1 is high in level is reduced. Therefore, the electric charge stored in C3 is reduced to a level below the voltage value of Vcc. Consequently, the output voltage of OA1 is high in level. Conversely, if the phase of the input signal of CP1 leads by more than 180 degrees, the circuit operation is reversed, making the output voltage of OA1 low in level. When the clock signal goes low in level, D-FF5 transfers the output signal of OA1 to the input terminal of CP2. Depending on whether the output voltage OA1 is high or low in level immediately before the clock signal goes low in level, integrating comparator 4 outputs a current in either the discharging direction or the drawing direction, as with the example shown in FIG. 5. At this time, the clock signal is input through INV2 to terminal 3 of SW4, bringing SW4 into the ON state to reset the voltage at terminal 2 of C3 to Vcc.

The output current Iout of integrating circuit 4 according to the above two examples is converted into a voltage Vout' according to the following equation 7, with the discharging direction being assumed to be positive:

$$Vout' = \frac{Iout \cdot ts}{C} + Vout \quad \text{[Equation 7]}$$

where C represents the capacitance value of capacitor C1, ts the time in which the clock level is kept low in level, and Vout the voltage value across capacitor C1 immediately before the clock signal goes low in level.

Figure 7:
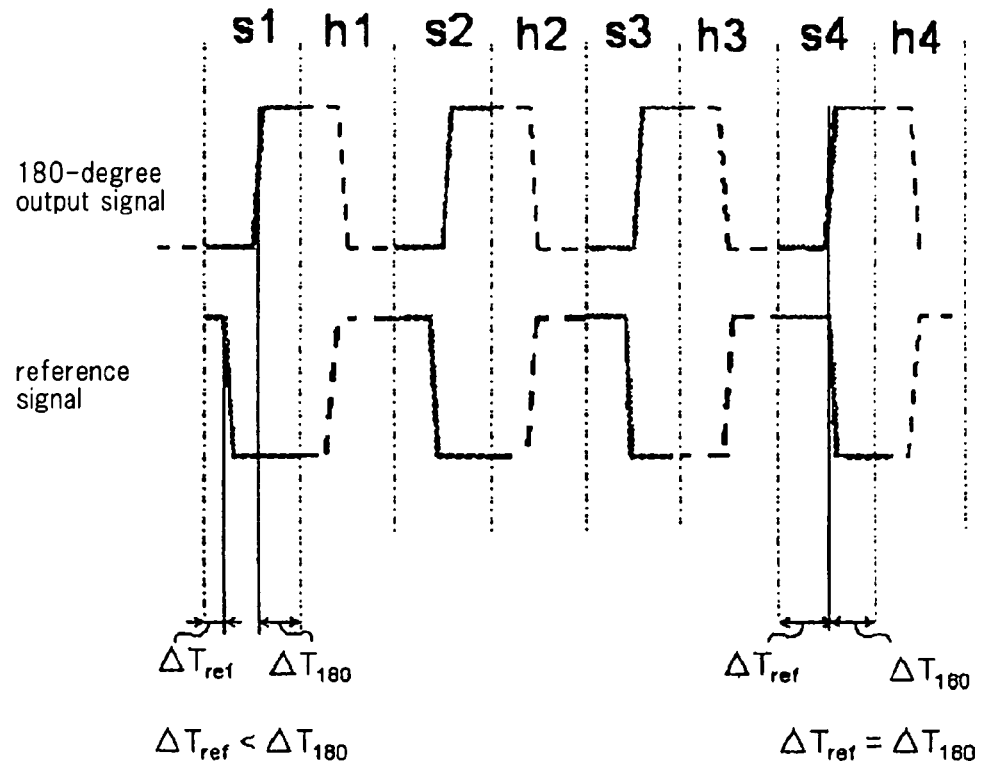
FIG. 7 is a first timing chart illustrative of operation of the first exemplary embodiment of the present invention.

FIG. 7 is a timing chart illustrative of circuit operation of the present exemplary embodiment.

In FIG. 7, the upper curve indicates the temporal transition of the 180-degree output signal of replica 1 and the lower curve the temporal transition of the reference signal. In FIG. 7, the vertical broken lines represent timings at which the 90-degree output signal of replica 1 which is input to the clock terminal of integrating comparator 4 changes between the high and low levels. In FIG. 7, zones s1, s2, s3, s4 represent zones in which the clock signal is high in level and integrating comparator 4 is in integrating operation. Zones h1, h2, h3, h4 represent zones in which the clock signal is low in level and integrating comparator 4 outputs a current depending on the integral values of the two input signals in a preceding zone, these zones having a duration defined as a holding time.

Circuit operation in the case where the phase delays of the 180-degree output signal and the 90-degree output signal of replica 1 are greater than design values of 180 degrees and 90 degrees due to fabrication process variations will be described below.

Since the phase delays of the 180-degree output signal and the 90-degree output signal are considered to be affected by about the same phase delays by the variations, the difference between the phase delays is 90 degrees after they have been affected by the variations. Consequently, the time $\Delta T_{180}$ of the high-level state of the 180-degree output signal in the sampling time is about one-half the sampling time at all times, and the integral value thereof essentially constant.

Figure 1:
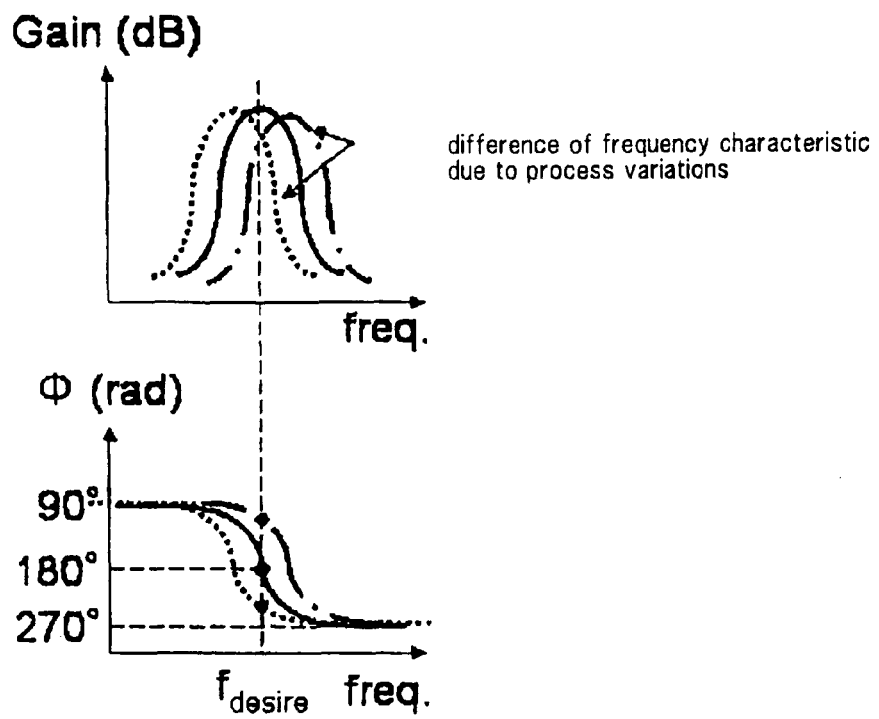
FIG. 1 is a diagram of frequency characteristics of a second-order bandpass filter.
Figure 2:
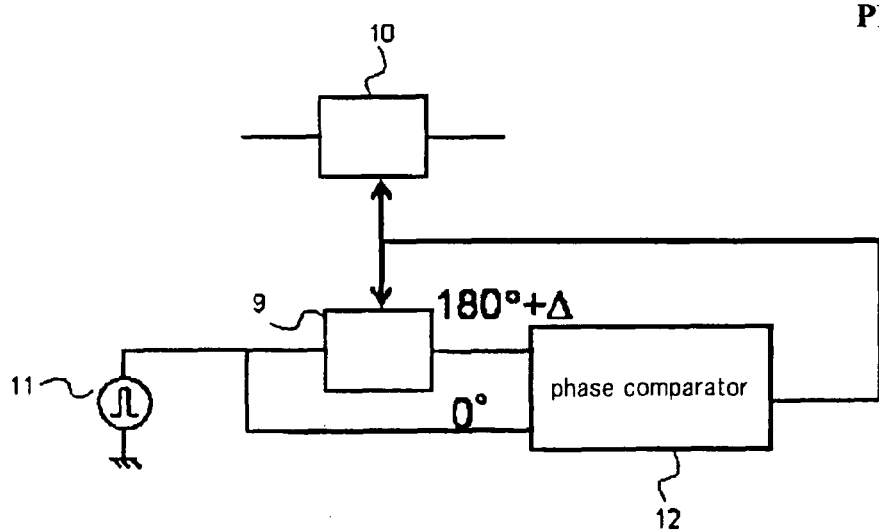
FIG. 2 shows an automatic adjustment circuit according to the background art.

Inasmuch as the reference signal leads the clock signal by 90 degrees or more, the time $\Delta T_{ref}$ of the high-level state thereof in the sampling time is shorter than one-half the sampling time, and the integral value thereof is reduced. Since $\Delta T_{ref}$ is shorter than $\Delta T_{180}$, integrating comparator 4 outputs a current in the discharging direction in zone h1. As the potential at terminal 2 of capacitor C1 increases, the frequency characteristics of replica 1 are adjusted so as to be shifted toward higher frequencies. As can be seen from FIG. 1, when the frequency characteristics are shifted toward higher frequencies, the phase leads, making the phase delays of the reference signal and the 180-degree output signal closer to 180 degrees.

If the phase delays of the 180-degree output signal and the 90-degree output signal of replica 1 are smaller than design values of 180 degrees and 90 degrees, then the circuit operation is reversed, making the phase delay of the 180-degree output signal closer to 180 degrees. Finally, the phase delay of the 180-degree output signal substantially becomes a design value of 180 degrees to stabilize the circuit operation (zone s4 in FIG. 7).

Figure 8:
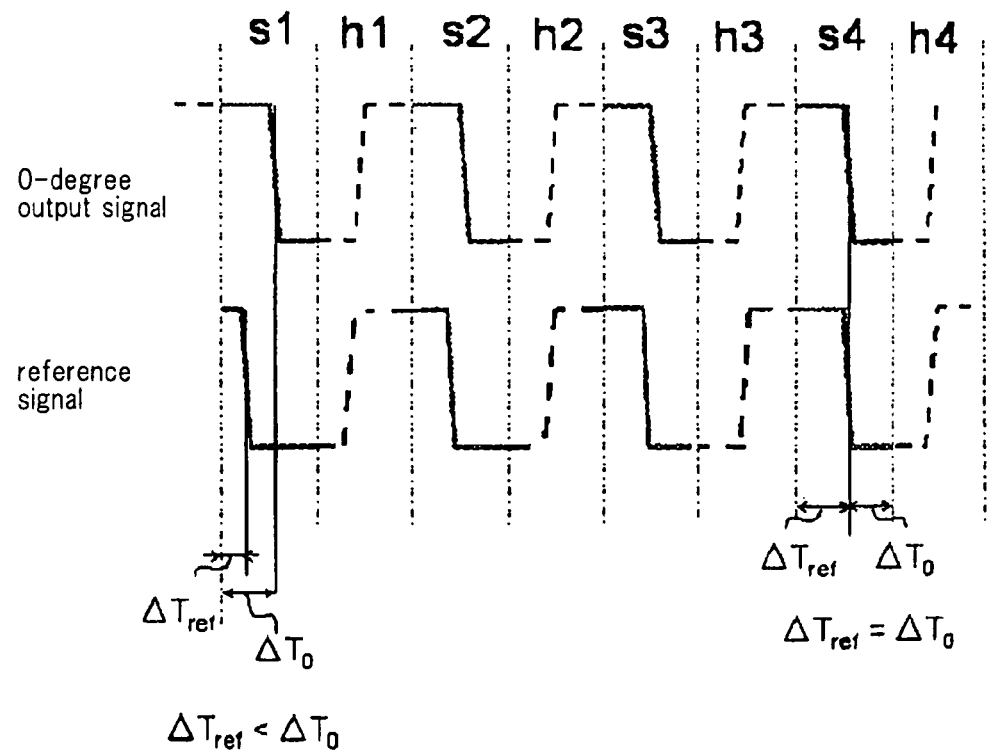
FIG. 8 is a second timing chart illustrative of operation of the first exemplary embodiment of the present invention.

According to the present exemplary embodiment, the same advantages can be achieved if replica 1 has a new terminal for outputting a 0-degree output signal which has a phase difference of 0 degree with the input signal and the new terminal, rather than the 180-degree output signal terminal, is connected to the positive terminal of integrating comparator 4. The 0-degree output signal can be produced by connecting an inverting circuit to the 180-degree output signal, for example. FIG. 8 is a timing chart illustrative of operation of the present exemplary embodiment thus modified.

In FIG. 8, the upper curve represents the 0-degree output signal of replica 1 and the lower curve the reference signal. If the phase of the 0-degree output signal lags behind the phase of the reference signal, then the relationship between these signals and the clock signal is indicated in zone s1 in FIG. 8. In zone s1, since the integral value of the 0-degree output signal is greater, integrating comparator 4 outputs a current in the discharging direction, increasing the voltage at the frequency characteristic terminals of replica 1 and main filter unit 3. Therefore, the phase of the 0-degree output signal leads, and the difference between itself and the phase of the reference signal approaches 0 degree. If the phase of the 0-degree output signal leads the phase of the reference signal, then the circuit operation is reversed, lowering the voltage at the frequency characteristic terminals. Therefore, the phase of the 0-degree output signal lags, and the difference between itself and the phase of the reference signal approaches 0 degree. Finally, the circuit becomes stable when the difference between the phase of the 0-degree output signal and the phase of the reference signal is nil.

In the above circuit operation, the processing operation of integrating comparator 4 on reference signal 2 and the 180-degree output signal or the 0-degree output signal of replica 1 is designed to be symmetrical. Accordingly, any offset error due to the parasitic phase delay in the present exemplary embodiment is small. As timing is designed such that the level inversion between the high and low levels of each of the above two signals occurs once in the sampling time, offset errors caused upon the level inversion cancel out each other and hence are small. Furthermore, since the present exemplary embodiment is made up of a minimum required number of circuit components, the absolute phase delays are small. For the above reasons, highly accurate, high-speed phase detection is realized, and automatic filter adjustment which is highly accurate and capable of high-speed operation is realized.

Embodiment 1

Figure 9:
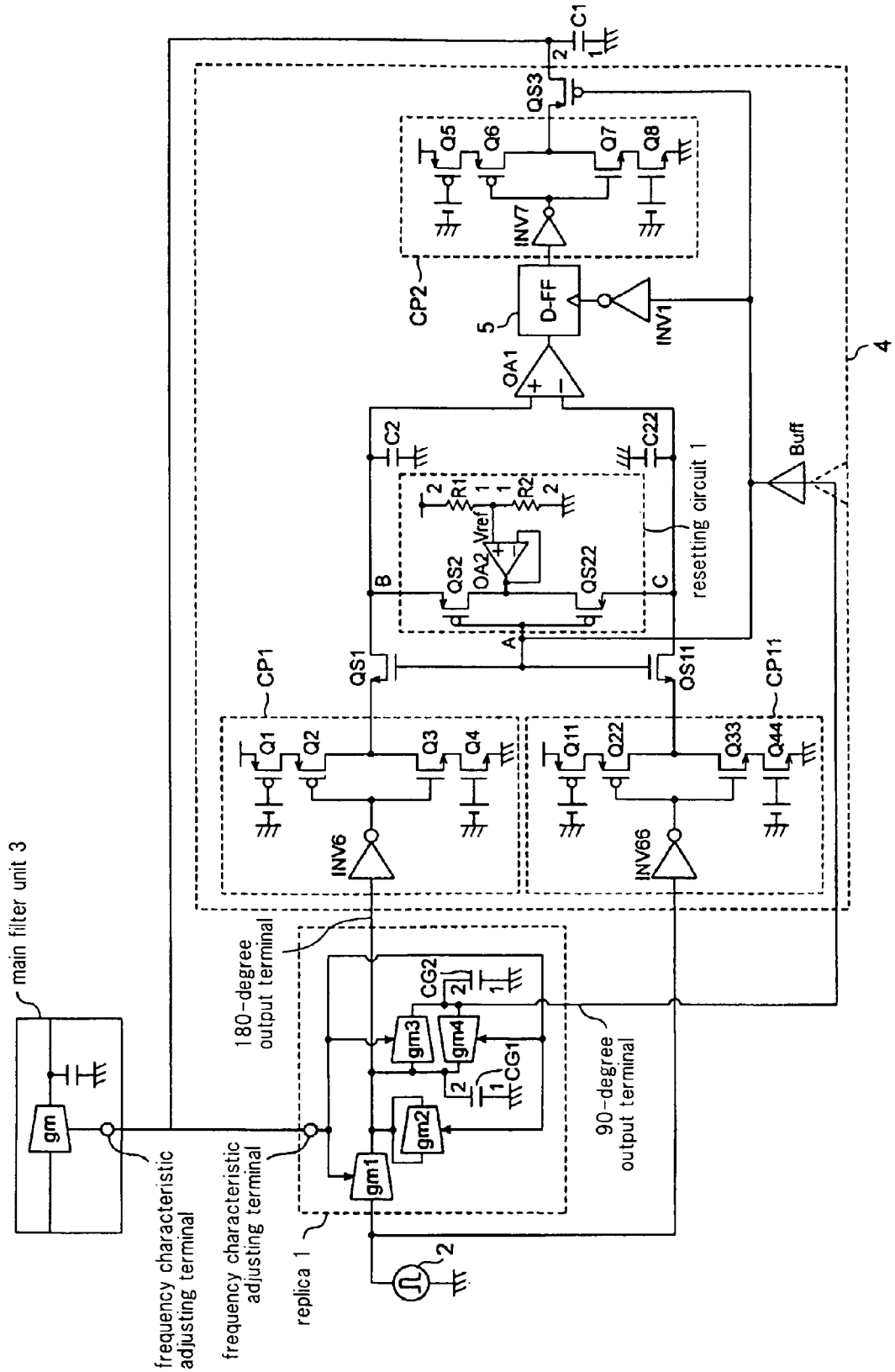
FIG. 9 is a circuit diagram of an automatic adjustment circuit according to a first embodiment of the present invention.

FIG. 9 shows an embodiment representing specific details of the first exemplary embodiment.

As with FIG. 3, the present embodiment comprises replica 1, reference signal 2, main filter unit 3, integrating comparator 4, and capacitor C1. These circuit components are connected in the same manner as with FIG. 3. Specific circuits of the respective blocks will be described below.

Main filter unit 3 is a gm-C filter comprising gm amplifiers and capacitors. Replica 1 is a second-order biquad filter comprising gm amplifiers gm1, gm2, gm3, gm4 and capacitors CG1, CG2 which are designed according to the same circuit topology as with main filter unit 3. Replica 1 has an input terminal connected therein to the input terminal of gm1, and an output terminal connected to the output terminal gm1, the input and output terminals of gm2, the input terminal of gm3, the output terminal of gm4, and terminal 2 of CG1 having terminal 1 grounded, in parallel relation to each other. The 90-degree output terminal of replica 1 is connected to the output terminal of gm3, the input terminal of gm4, and terminal 2 of CG2 having terminal 1 grounded, in parallel relation to each other. The frequency characteristic adjusting terminal of replica 1 is connected to the gm value adjusting terminals of the respective gm amplifiers in parallel relation to each other.

Integrating comparator 4 comprises charge pumps CP1, CP11, CP2, inverting circuit INV1, buffer circuit Buff, voltage comparing circuit OA1, delayed flip-flop D-FF, capacitors C2, C22, resetting circuit 1, n-type MOS transistors QS1, QS11, and p-type MOS transistor QS3. Identical names are assigned to those circuits of integrating comparator 4 which are identical to those shown in FIG. 5.

Integrating comparator 4 has two input terminals which are connected to respective input terminals of CP1, CP11 therein. Integrating comparator 4 has an output terminal and a clock terminal which are connected respectively to the drain terminal of QS3 and the input terminal of Buff therein. The output terminals of CP1, CP11 are connected to the respective source terminals of QS1, QS11. The gate terminals of QS1, QS11 are connected to terminal A of resetting circuit 1, the output terminal of Buff, the input terminal of INV1, and the gate terminal of QS3 in parallel relation to each other. The drain terminals of QS1, QS11 are connected respectively to terminals B, C of resetting circuit 1, terminals 2 of capacitors C2, C22 whose terminals 1 are grounded, and the positive and negative terminals of OA1. The output terminal of OA1 is connected to the input terminal of D-FF5, whose output terminal is connected to the input terminal of CP2. The clock terminal of D-FF5 is connected to the output terminal of INV1. The output terminal of CP2 is connected to the source terminal of QS3.

CP1 comprises inverting circuit INV6, p-type MOS transistors Q1, Q2, and n-type MOS transistors Q3, Q4. The input terminal of CP1 is connected therein to the input terminal of INV6, whose output terminal is connected to the gate terminals of Q2, Q3 in CP1. The drain terminals of Q2, Q3 are connected to each other and also connected to the output terminal of CP1. Q1 serves as a constant-current circuit having a drain terminal connected to the source terminal of Q2, a source terminal connected to a power supply, and a gate terminal connected to a constant-voltage source. Q4 serves as a constant-current circuit having a drain terminal connected to the source terminal of Q3, a source terminal connected to ground, and a gate terminal connected to a constant-voltage source. The voltage values of the constant-voltage sources which are applied to the gate terminals of Q1, Q4 are set to values for Q1, Q4 serving as constant-current sources to discharge/draw currents of the same value. When the input signal of CP1 is high in level, the input signal is inverted in level by INV6, and then applied as a low-level signal to the gates of Q2, Q3. INV6 also serves as a matching circuit for shaping the input signal, which is supplied as a sine-wave input signal, into a rectangular wave. Q2 forms a channel between its drain and source terminals and discharges the current of constant-current source Q1 to the output terminal of CP1. Q3 does not output the current of constant-current source Q4 to the output terminal because the current between its drain and source terminals is essentially nil. When the input signal of CP1 is low in level, the current between the source and drain terminals of Q3 is essentially nil. Q3 forms a channel between its drain and source terminals and draws the current from the output terminal of CP1 to constant-current source circuit Q4. CP11, CP2 are identical in structure to CP1, with Q11, Q5 corresponding to Q1, Q22, Q6 to Q2, Q33, Q7 to Q3, Q44, Q8 to Q4, and INV66, INV7 to INV6.

Resetting circuit 1 comprises p-type MOS transistors QS2, QS22, voltage comparing circuit OA2, and resistors R1, R2. Resetting circuit 1 has terminal A connected to the gate terminals of QS2, QS22 therein, and terminals B, C connected to the source terminals of QS2, QS22 therein. OA2, R1, R2 correspond to voltage source Vcc shown in FIG. 5 as described below. The positive terminal of OA2 is connected to terminals 1 of resistors R1, R2 and the negative terminal thereof short-circuited to the output terminal of OA2. Terminals 2 of R1, R2 are connected respectively to a power supply and ground. With this arrangement, the voltage Vref at the positive terminal of OA2 is expressed according to the following equation 8, in relation to the power supply voltage Vdd:

$$Vref = \frac{R2}{R1+R2} \cdot Vdd \qquad \text{[Equation 8]}$$

OA2 operates to keep the positive and negative terminals thereof at the same potential at all times. Therefore, no matter what circuit may be connected to the output terminal OA2, the output potential of OA2 is maintained at Vref at all times.

OA1 thus operates as a constant-voltage source. QS2, QS22 operate as switch circuits. When a low-level signal is input to the gate terminal of each of QS2, QS22, the source and drain terminals thereof are connected to each other. When a high-level signal is input to the gate terminal thereof, the source and drain terminals thereof are disconnected from each other. The source terminals of QS2, QS22 are connected respectively to terminals 2 of capacitors C2, C22, and the drain terminals there are connected to each other and also to the output terminal of OA2 in parallel relation to each other. When a low-level signal is applied to terminal A of resetting circuit 1, resetting circuit 1 sets the potentials at the nodes connected to terminals B, C to Vref. Conversely, when a high-level signal is applied to terminal A, since terminals B, C are disconnected from the inside of resetting circuit 1, the nodes connected to terminals B, C are not affected.

Inasmuch as the circuit according to the present embodiment represents a specific arrangement of the first exemplary embodiment shown in FIG. 5, the circuit operation of the present embodiment is the same as the circuit operation of the first exemplary embodiment.

According to the present embodiment, as with the first exemplary embodiment, the processing operation of integrating comparator 4 on reference signal 2 and the 180-degree output signal or the 0-degree output signal of replica 1 is designed to be symmetrical. Accordingly, any offset error due to the parasitic phase delay in the present embodiment is small. As described above, the circuit operation of the present embodiment is the same as with the first exemplary embodiment shown in FIG. 5. As timing is designed such that the level inversion between the high and low levels of each of the above two signals occurs once in the sampling time, offset errors caused upon the level inversion cancel out each other and hence are small. Furthermore, since the present embodiment is made up of a minimum required number of circuit components, the absolute phase delays are small. For the above reasons, according to the present embodiment, highly accurate, high-speed phase detection is realized, and automatic filter adjustment which is highly accurate and capable of high-speed operation is realized.

2nd Exemplary Embodiment

Figure 10:
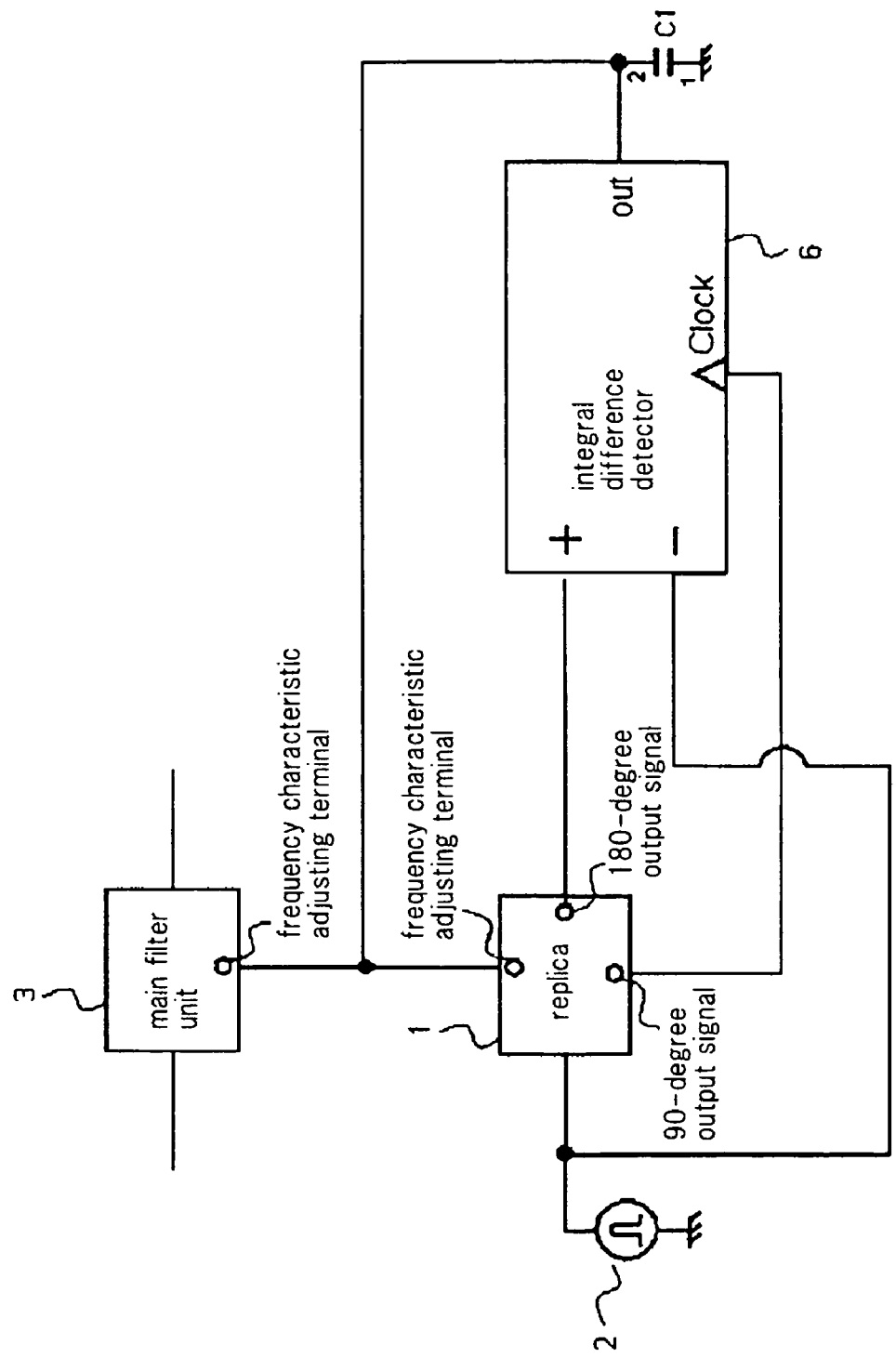
FIG. 10 is a circuit diagram of an automatic adjustment circuit according to a second exemplary embodiment of the present invention.

FIG. 10 is a diagram of an automatic adjustment circuit according to a second exemplary embodiment of the present invention. The automatic adjustment circuit is incorporated in a filter circuit. In FIG. 10, those components and circuit blocks which are identical to those shown in FIG. 3 are denoted by identical names and numbers.

In FIG. 10, 3 denotes a main filter unit and 1 a replica made up of a portion of a circuit block of main filter unit 3. Main filter unit 3 and replica 1 have respective frequency characteristic adjusting terminals. As a voltage applied to the frequency characteristic adjusting terminals goes higher, the frequency is adjusted to be higher. The frequency characteristic adjusting terminals of replica 1 and main filter unit 3 are connected to each other, and replica 1 and main filter unit 3 have respective frequency characteristics simultaneously adjusted to an optimum state. Replica 1 outputs a 180-degree output signal and a 90-degree output signal that are delayed in phase by 180 degrees and 90 degrees, respectively, from reference signal 2 input to replica 1. Integral difference detector 6 has a positive terminal, a negative terminal, a clock terminal, and an output terminal which are connected respectively to the 180-degree output signal, reference signal 2, the 90-degree output signal, and the frequency characteristic adjusting terminals of replica 1 and main filter unit 3. Capacitor C1 is connected between the output terminal of integral difference detector 6 and ground.

The above arrangement is provided by replacing integrating comparator 4 according to the first exemplary embodiment shown in FIG. 3 with integral difference detector 6.

Integral difference detector 6 is a circuit for outputting a current depending on the difference between integral values of signals that are input to the positive and negative terminals thereof.

Figure 11:
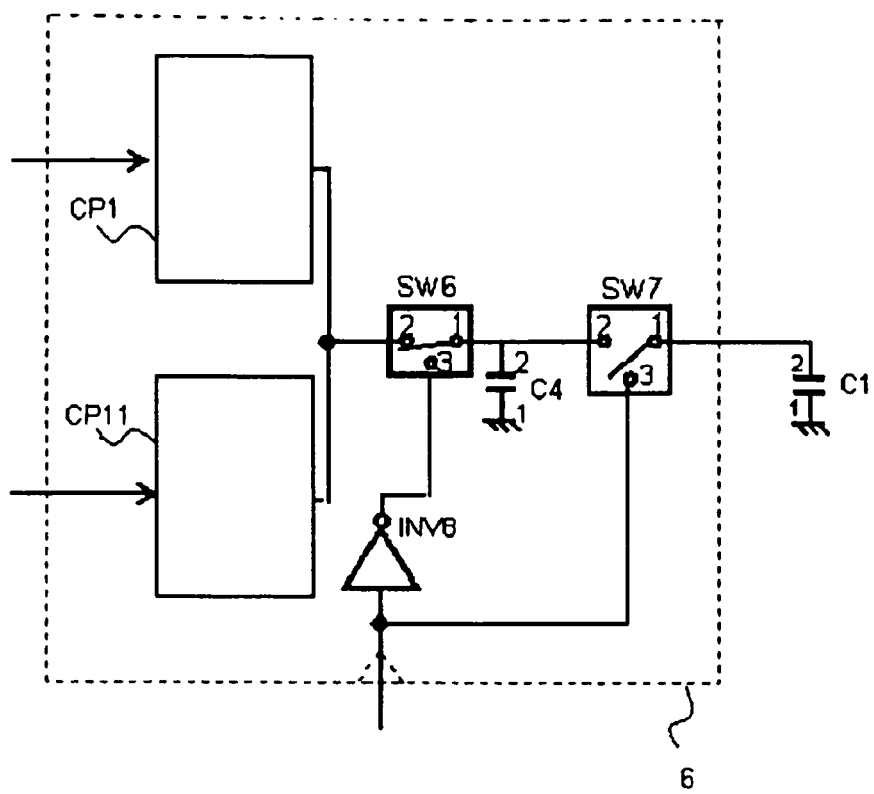
FIG. 11 is a circuit diagram showing an example of an integral difference detector which is included in the second exemplary embodiment of the present invention.

FIG. 11 shows an example of the configuration of integral difference detector 6. In FIG. 11, those components and blocks which are identical to those of integrating comparator 4 shown in FIG. 5 are denoted by identical names and numbers.

Integral difference detector 6 comprises charge pumps CP1, CP11, switch circuits SW6, SW7, capacitor C4, and inverting circuit INV8. Integral difference detector 6 has two input terminals which are connected to respective input terminals of CP1, CP11 therein. CP1, CP11 have respective output terminals connected to each other and also to terminal 2 of SW6. Terminal 1 of SW6 is connected to terminal 2 of SW7 and terminal 2 of capacitor C4 whose terminal 1 is grounded, in parallel relation to each other. Terminal 1 of SW7 is connected to the output terminal of integral difference detector 6. The clock terminal of integral difference detector 6 is connected to terminal 3 of SW7 and the input terminal of INV8 therein. The output terminal of INV8 is connected to terminal 3 of SW6.

When a high-level signal is input to CP1, CP2, CP1, CP2 output a current $I_{CPout}$ which is positive in the discharging direction. When a low-level signal is input to CP1, CP2, CP1, CP2 output $-I_{CPout}$.

When a high-level signal is applied to terminal 3 of each of SW6, SW7, it connects terminal 1 and terminal 2 to each other (ON state). When a low-level signal is applied to terminal 3 of each of SW6, SW7, it disconnects terminal 1 and terminal 2 from each other (OFF state).

While the clock signal is low in level (during the sampling time), since a low-level signal is applied to terminal 3 of SW7, SW7 is in the OFF state. As the clock signal is inverted by INV8 and applied as a high-level signal to terminal 3 of SW6, SW6 is in the ON state. Depending on whether the input signal is high or low in level, CP1, CP11 stores an electric charge in or draws an electric charge from terminal 2 of capacitor C4. The electric charge $\Delta Q_S$ stored in terminal 2 of capacitor C4 during sampling time ts is the sum of an electric charge $Q_{CP1}$ supplied from CP1 and an electric charge $Q_{CP2}$ supplied from CP2. $\Delta Q_S$ is expressed according to the following equation 9:

$$\Delta Q_S = Q_{CP1} + Q_{CP2} \quad \text{[Equation 9]}$$

If it is assumed that a high-level signal is input to CP1 during time $ts_{CP1\_H}$, a low-level signal is input to CP1 during time $ts_{CP1\_L}$, a high-level signal is input to CP2 during time $ts_{CP2\_H}$, and a low-level signal is input to CP2 during time $ts_{CP2\_L}$, then $Q_{CP1}$, $Q_{CP2}$ are expressed according to the following equations 10, 11:

$$Q_{CP1} = I_{CPout}(ts_{CP1\_H} - ts_{CP1\_L}) \quad \text{[Equation 10]}$$

$$Q_{CP2} = I_{CPout}(ts_{CP2\_H} - ts_{CP2\_L}) \quad \text{[Equation 11]}$$

where ts is expressed according to the following equation 12:

$$ts = ts_{CP1\_H} + ts_{CP1\_L} = ts_{CP2\_H} + ts_{CP2\_L} \quad \text{[Equation 12]}$$

If the input signal of CP1 is delayed in phase by 180 degrees from the input signal of CP2, then one of the input signals is high in level and the other low in level. Accordingly, the electric charge newly stored in C4 is nil. It is derived from the equations 9, 10, 11 that $\Delta Q_S$ is nil as $\text{ts}_{CP1\_H}$ and $\text{ts}_{CP2\_L}$ are equal to each other and $\text{ts}_{CP1\_L}$ and $\text{ts}_{CP2\_H}$ are equal to each other.

If the clock signal is delayed in phase by nearly 90 degrees from the input signal of CP2 and the input signal of CP1 is delayed in phase by about 180 degrees from the input signal of CP2, then within the sampling time in which the clock signal is low, the input signal of CP1 is initially high and finally low, and the input signal of CP2 is initially low and finally high. Therefore, if the phase delay of the input signal of CP1 with respect to the input signal of CP2 is greater than 180 degrees, then the time $\text{ts}_{CP1\_H}$ in which the high-level signal is input to CP1 or the time $\text{ts}_{CP2\_H}$ in which the high-level signal is input to CP2 is increased, and the time $\text{ts}_{CP1\_L}$ in which the low-level signal is input to CP1 or the time $\text{ts}_{CP2\_L}$ in which the low-level signal is input to CP2 is reduced. Consequently, the electric charge $\Delta Q_S$ stored in C4 is increased. Conversely, if the phase delay of the input signal of CP1 is smaller than 180 degrees, then $\Delta Q_S$ is reduced. If the phase delay of the input signal of CP1 with respect to the input signal of CP2 is represented by $\pi+\Delta\phi$ (rad), then a value $\Delta t$ produced by subtracting $\text{ts}_{CP2\_L}$ from $\text{ts}_{CP1\_H}$ is expressed according to the following equation 13:

$$\Delta t = \frac{ts \cdot \Delta\phi}{\pi} \qquad \text{[Equation 13]}$$

$\Delta Q_S$ is expressed according to the following equation 14:

$$\Delta Q_s = 2 \cdot I_{CPout} \cdot \Delta t = \frac{2 \cdot I_{CPout} \cdot ts \cdot \Delta\phi}{\pi} \qquad \text{[Equation 14]}$$

When the clock signal goes high in level, SW6 is brought into the OFF state and SW7 into the ON state, connecting C4 to terminal 2 of external capacitor C1 that is connected to the output terminal of integral difference detector 6. $\Delta Q_S$ is distributed to equalizes the potentials at terminals 2 of C4, C1. In the state which is one period of the clock signal earlier, terminals 2 of C4, C1 are connected to each other and at the same potential. Therefore, potential increase $\Delta$Vout at terminal 2 of C1 is of a value produced by dividing $\Delta Q_S$ obtained in the preceding sampling cycle by the capacitance value of C1, C4, as indicated by the equation 15:

$$\Delta Vout = \frac{\Delta Q_s}{C1+C4} = \frac{2 \cdot I_{CPout} \cdot ts \cdot \Delta\phi}{(C1+C4) \cdot \pi} \qquad \text{[Equation 15]}$$

When the clock signal goes low in level again, SW7 is brought into the OFF state, saving potential increase $\Delta$Vout at terminal 2 of C1. The equation 15 indicates that integral difference detector 15 outputs a voltage depending on the phase difference between CP1, CP2.

According to the second exemplary embodiment shown in FIG. 10, the output signal of integral difference detector 6 is input to the frequency characteristic adjusting terminals of replica 1 and main filter unit 3. If the adjustment sensitivity of the frequency characteristic adjusting terminals, i.e., a change in the phase at the time the voltage applied to the frequency characteristic adjusting terminals is increased by a unit voltage, is represented by $\alpha$, then loop gain G is expressed according to the following equation 16:

$$G = \frac{\alpha \cdot \Delta Vout}{\Delta\phi} = \frac{2 \cdot \alpha \cdot I_{CPout} \cdot ts}{(C1+C4) \cdot \pi} \qquad \text{[Equation 16]}$$

If the phase delay of the 180-degree output signal of replica 1 from the reference signal deviates $\Delta\phi$ from 180 degrees, then each time integral difference detector 6 repeats its sampling operation, the phase delay becomes closer to 180 degrees by $G \times \Delta\phi$. By designing G to be smaller than 1, the circuit operation is finally stabilized when the phase difference reaches 180 degrees.

In the above circuit operation, the processing operation of integrating comparator 4 on reference signal 2 and the 180-degree output signal of replica 1 is designed to be symmetrical. Accordingly, any offset error due to the parasitic phase delay in the present exemplary embodiment is small. As timing is designed such that the level inversion between the high and low levels of each of the above two signals occurs once in the sampling time, offset errors caused upon the level inversion cancel out each other and hence are small. Furthermore, since the present exemplary embodiment is made up of a minimum required number of circuit components, the absolute phase delays are small. For the above reasons, highly accurate, high-speed phase detection is realized, and automatic filter adjustment which is highly accurate and capable of high-speed operation is realized.

3rd Exemplary Embodiment

Figure 12:
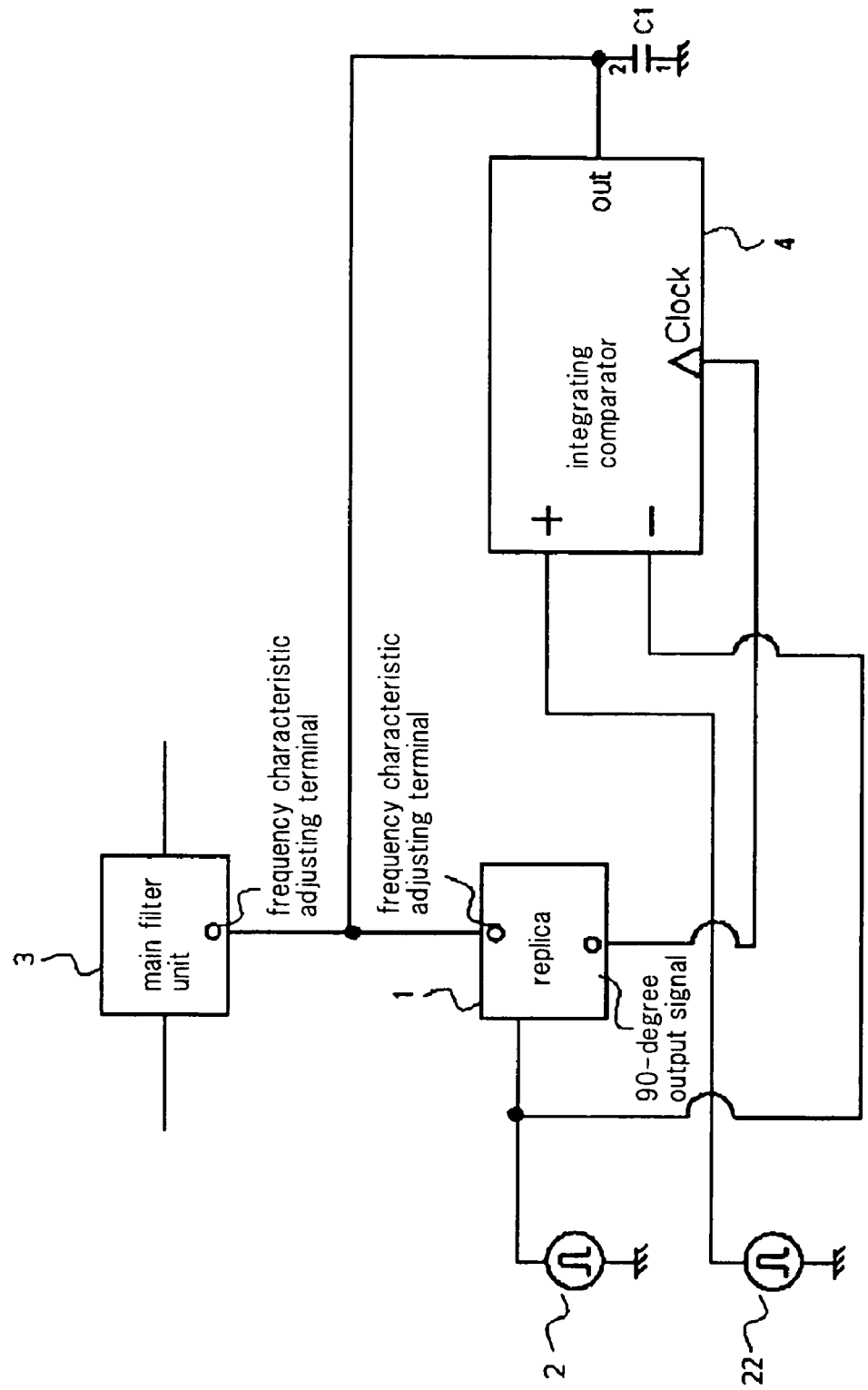
FIG. 12 is a circuit diagram of an automatic adjustment circuit according to a third exemplary embodiment of the present invention.

FIG. 12 is a diagram of an automatic adjustment circuit according to a third exemplary embodiment of the present invention. The automatic adjustment circuit is incorporated in a filter circuit. In FIG. 12, those components and circuit blocks which are identical to those shown in FIG. 3 are denoted by identical names and numbers.

In FIG. 12, 3 denotes a main filter unit and 1 a replica made up of a portion of a circuit block of main filter unit 3. Main filter unit 3 and replica 1 have respective frequency characteristic adjusting terminals. As a voltage applied to the frequency characteristic adjusting terminals goes higher, the frequency is adjusted to be higher. The frequency characteristic adjusting terminals of replica 1 and main filter unit 3 are connected to each other, and replica 1 and main filter unit 3 have respective frequency characteristics simultaneously adjusted to an optimum state. Replica 1 outputs a 90-degree output signal that is delayed in phase by 90 degrees from reference signal 2 input to replica 1. Integrating comparator 4 has a positive terminal, a negative terminal, a clock terminal, and an output terminal which are connected respectively to reference signal 22, reference signal 2, the 90-degree output signal, and the frequency characteristic adjusting terminals of replica 1 and main filter unit 3. Reference signal 22 is a signal which is delayed in phase by 180 degrees from reference signal 2. Capacitor C1 is connected between the output terminal of integrating comparator 4 and ground.

The above arrangement is provided by replacing the 180-degree output signal of replica 1 in the first exemplary embodiment shown in FIG. 3, with reference signal 22 which is delayed in phase by 180 degrees from reference signal 2, as an input signal applied to the positive terminal of integrating comparator 4. The individual circuits according to the present exemplary embodiment operate in the same manner as the individual circuits according to the first exemplary embodiment.

Figure 13:
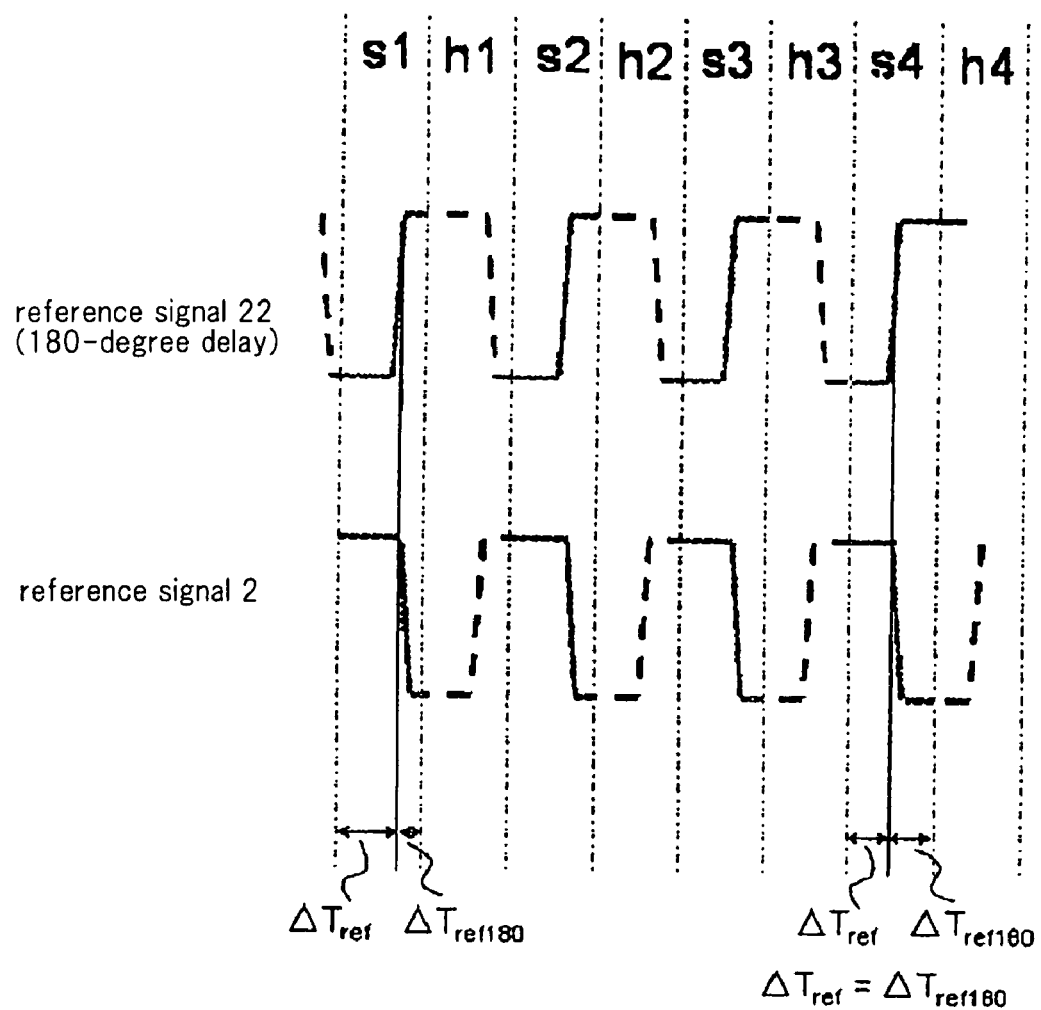
FIG. 13 is a timing chart illustrative of operation of the third exemplary embodiment of the present invention.

FIG. 13 is a timing chart illustrative of circuit operation of the present exemplary embodiment.

In FIG. 13, the upper curve indicates the temporal transition of reference signal 22 and the lower curve the temporal transition of reference signal 2. The vertical broken lines represent timings at which the 90-degree output signal of replica 1 which is input to the clock terminal of integrating comparator 4 changes between the high and low levels. In FIG. 13, zones s1, s2, s3, s4 states in which the clock signal is high in level and integrating comparator 4 is in sampling operation. Zones h1, h2, h3, h4 represent states in which the clock signal is low in level and integrating comparator 4 outputs a current depending on the integral values of the two input signals in a preceding zone. If the phase delay of the 90-degree output signal of replica 1 with respect to reference signal 2 is smaller than 90 degrees, then the time in which reference signal 2 is high in level within the sampling time is increased, and the time in which reference signal 22 is high in level is reduced. Zone s1 in FIG. 13 shows such a state. As the integral value of reference signal 2 in the sampling time is greater than the integral value of reference signal 22, integrating comparator 4 outputs a current in the drawing direction. The voltage at the frequency characteristic adjusting terminal of replica 1 is lowered, the phase of the 90-degree output signal of replica 1 lags, and the phase difference between the 90-degree output signal of replica 1 and reference signal 2 becomes closer to 90 degrees.

Conversely, if the phase delay of the 90-degree output signal of replica 1 lags behind reference signal 2 by more than 90 degrees, then the circuit operation is reversed, so that the phase of the 90-degree output signal of replica 1 leads, and the phase difference between the 90-degree output signal of replica 1 and reference signal 2 becomes closer to 90 degrees. As indicated in zone s4 in FIG. 13, the circuit is finally stabilized when the phase difference between the 90-degree output signal of replica 1 and reference signal 2 reaches 90 degrees.

In the above circuit operation, as with the first exemplary embodiment, the processing operation of integrating comparator 4 on reference signal 2 and reference signal 22 is designed to be symmetrical. Accordingly, any offset error due to the parasitic phase delay in the present exemplary embodiment is small. As timing is designed such that the level inversion between the high and low levels of each of the above two signals occurs once in the sampling time, offset errors caused upon the level inversion cancel out each other and hence are small. Furthermore, since the present exemplary embodiment is made up of a minimum required number of circuit components, the absolute phase delays are small. For the above reasons, highly accurate, high-speed phase detection is realized, and automatic filter adjustment which is highly accurate and capable of high-speed operation is realized.

4th Exemplary Embodiment

Figure 14:
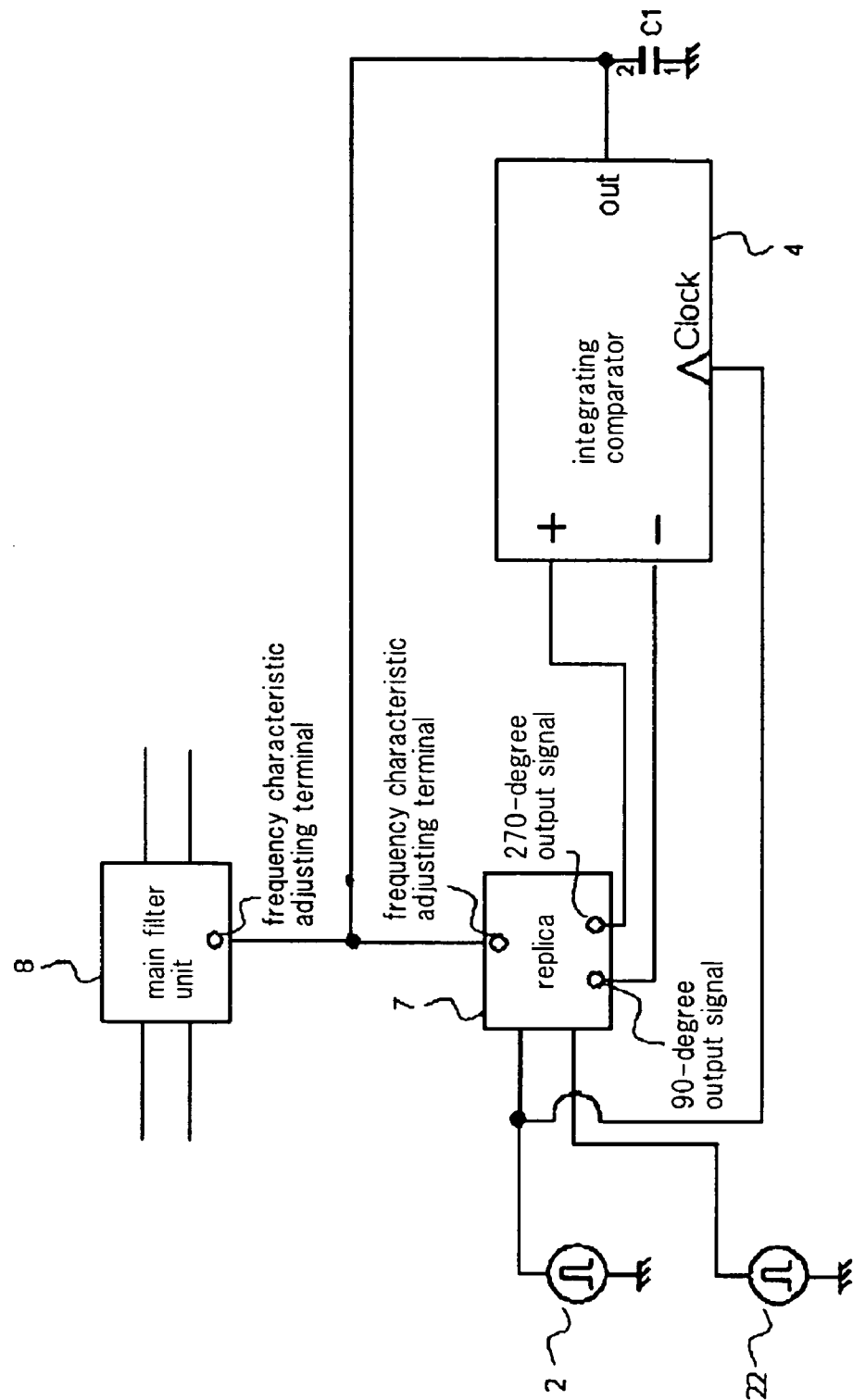
FIG. 14 is a circuit diagram of an automatic adjustment circuit according to a fourth exemplary embodiment of the present invention.

FIG. 14 is a diagram of an automatic adjustment circuit according to a fourth exemplary embodiment of the present invention. The automatic adjustment circuit is incorporated in a filter circuit. In FIG. 14, those components and circuit blocks which are identical to those shown in FIG. 3 are denoted by identical names and numbers.

In FIG. 14, 8 denotes a differential main filter unit and 7 a replica made up of a portion of a circuit block of main filter unit 8. 2 denotes a reference signal and 22 a reference signal which has a phase difference of 180 degrees with reference signal 2. Main filter unit 8 and replica 7 have respective frequency characteristic adjusting terminals. As a voltage applied to the frequency characteristic adjusting terminals goes higher, the frequency is adjusted to be higher. The frequency characteristic adjusting terminals of replica 7 and main filter unit 8 are connected to each other, and replica 7 and main filter unit 8 have respective frequency characteristics simultaneously adjusted to an optimum state. Replica 7 is supplied with reference signals 2, 22 as differential signals input to differential input terminals, and outputs a 90-degree output signal and 270-degree output signal which are delayed in phase by 90 degrees and 270 degrees, respectively, from reference signal 2. Integrating comparator 4 has a positive terminal, a negative terminal, a clock terminal, and an output terminal which are connected respectively to the 270-degree output signal of replica 7, the 90-degree output signal of replica 7, reference signal 2, and the frequency characteristic adjusting terminals of replica 7 and main filter unit 8. Capacitor C1 is connected between the output terminal of integrating comparator 4 and ground.

Figure 15:
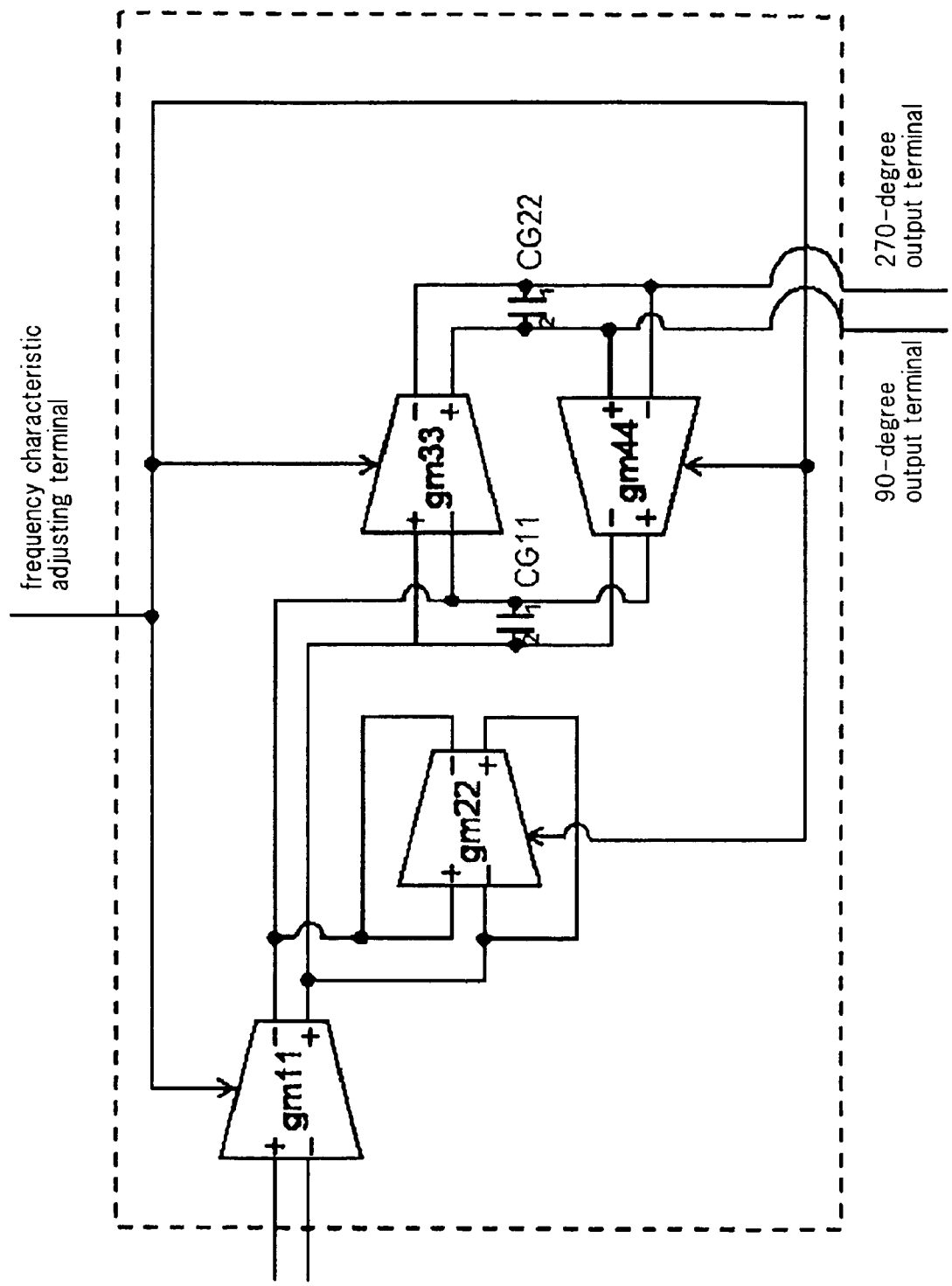
FIG. 15 is a circuit diagram showing an example of a replica which is included in the fourth exemplary embodiment of the present invention.

FIG. 15 shows an example of the configuration of replica 7.

gm11, gm22, gm33, and gm44 denote gm amplifiers which are designed according to the same circuit topology as the gm amplifiers of main filter unit 8, and CG1, CG2 denote capacitors. Replica 7 has differential input terminals connected therein to the differential input terminals of gm11. The differential output terminals of gm11 are connected to the differential input terminals of gm22, the differential input terminals of gm33, the differential input terminals of gm44, and terminals 1, 2 of CG11 in parallel relation to each other. The differential input terminals of gm22 are connected to the differential output terminals thereof, providing negative feedback loops. The differential output terminals of gm44 are connected to the differential input terminals of gm33 and the differential input terminals of gm44 are connected to the differential output terminals of gm33, such that the differential lines are twisted. The 90-degree and 270-degree output terminals are connected to the differential output terminals of gm33, the differential input terminals of gm44, and terminals 1, 2 of CG22 in parallel relation to each other. The frequency characteristic adjusting terminal is connected to the gm value adjusting terminals of the gm amplifiers in parallel relation to each other. The gm value adjusting terminals adjust the gm values depending on a voltage input thereto. When the same voltage is applied to the gm value adjusting terminals of the gm amplifiers which are thus connected, all the gm values can be varied at equal rates. The gm values of gm11, gm22, gm33, gm44 are represented by −g11, −g22, −g33, −g44, respectively, and the capacitance values of CG11, CG22 by C11, C22, respectively. Transfer functions of the 90-degree output signal and the 270-degree output signal with respect to the differential input signals are expressed respectively by the following equations 17, 18:

$$F_{90}(s) = \frac{\frac{g_{11} \cdot g_{33}}{C_{11} \cdot C_{22}}}{s^2 + \frac{g_{22}}{C_{11}}s + \frac{g_{33} \cdot g_{44}}{C_{11} \cdot C_{22}}} \quad \text{[Equation 17]}$$

$$F_{270}(s) = \frac{-\frac{g_{11} \cdot g_{33}}{C_{11} \cdot C_{22}}}{s^2 + \frac{g_{22}}{C_{11}}s + \frac{g_{33} \cdot g_{44}}{C_{11} \cdot C_{22}}} \quad \text{[Equation 18]}$$

The equations 17, 18 indicate that the respective phase delays of 90 and 270 degrees which are caused on the input signal whose angular frequency $\omega_{00}$ is represented by the value of the next equation 19.

$$\omega_{00} = \sqrt{\frac{g_{33} \cdot g_{44}}{C_{11} \cdot C_{22}}} \qquad \text{[Equation 19]}$$

The angular frequency of reference signals 2, 22 is set to $\omega_{00}/2\pi$. Therefore, the 90-degree output signal and the 270-degree output signal of replica 7 are designed to have respective phase delays of 90 degrees and 270 degrees with respect to the reference signals.

Figure 16:
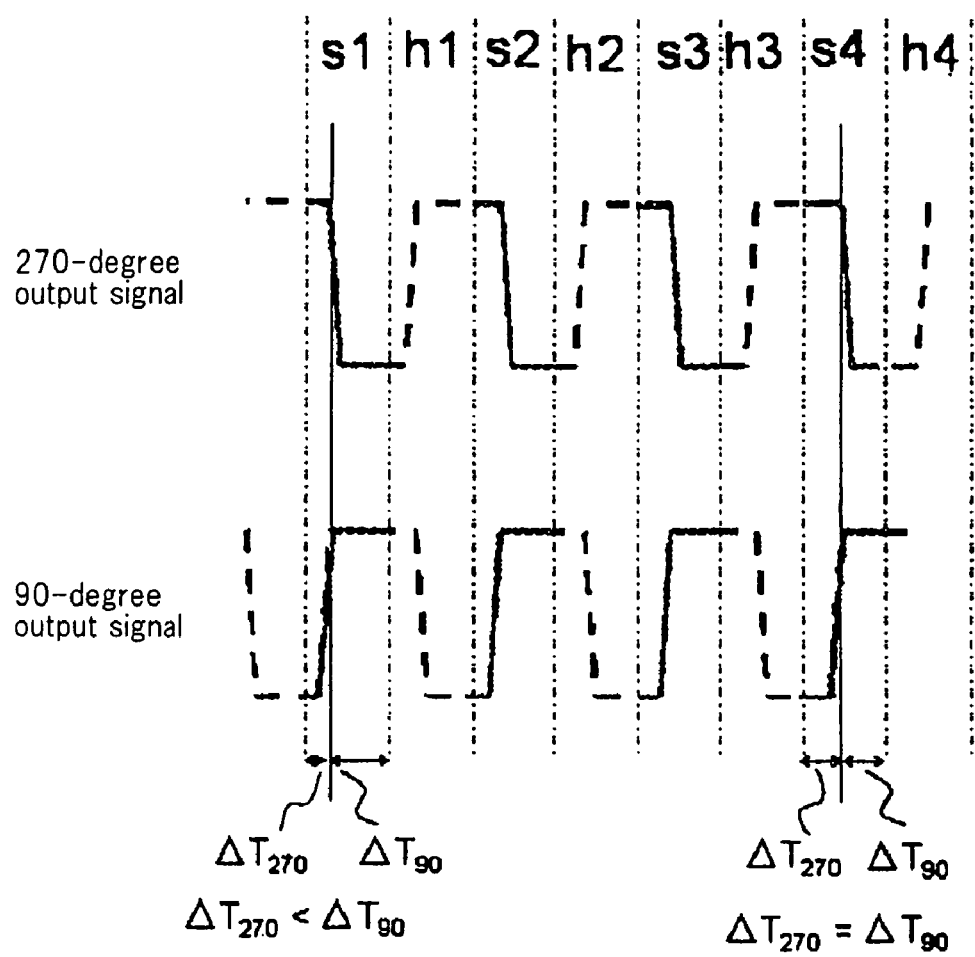
FIG. 16 is a timing chart illustrative of operation of the fourth exemplary embodiment of the present invention.

FIG. 16 is a timing chart illustrative of circuit operation of the present exemplary embodiment.

In FIG. 16, the upper curve indicates the 270-degree output signal of replica 7 and the lower curve the 90-degree output signal of replica 7. In FIG. 16, the vertical broken lines represent timings at which reference signal 2 which is input to the clock terminal of integrating comparator 4 changes between the high and low levels. In FIG. 16, zones s1, s2, s3, s4 represent states in which the clock signal is high in level and integrating comparator 4 is in integrating operation. Zones h1, h2, h3, h4 represent states in which the clock signal is low in level and integrating comparator 4 outputs a current depending on the integral values of the two input signals in a preceding zone. If the phase delays of the 90-degree output signal and the 270-degree output signal of replica 7 with respect to reference signal 2 is 90 degrees or more and 270 degree or more, respectively, then the time in which the 90-degree output signal is high in level within the sampling time is increased, and the time in which the 270-degree output signal is high in level is reduced. Zone s1 in FIG. 16 shows such a state.

Since the integral value of the 90-degree output signal is greater than the integral value of the 270-degree output signal in the sampling time, integrating comparator 4 outputs a current in the drawing direction. The voltage at the frequency characteristic terminal is lowered. Therefore, the phases of the 90-degree output signal and the 270-degree output signal lag, and the phase differences between themselves and reference signal 2 approach 90 degrees and 270 degrees, respectively. Conversely, if the phase delays of the 90-degree output signal and the 270-degree output signal of replica 7 lag behind reference signal 2 by more than 90 degrees and 270 degrees, then the circuit operation is reversed. Therefore, the phases of the 90-degree output signal and the 270-degree output signal lead, and the phase differences between themselves and reference signal 2 approach 90 degrees and 270 degrees, respectively. Finally, as indicated in zone s4, the circuit becomes stable when the phase differences between the 90-degree and 270-degree output signals and reference signal 2 reach 90 degrees and 270 degrees, respectively.

In the above circuit operation, as with the first exemplary embodiment, the processing operation of integrating comparator 4 on the 90-degree output signal and the 270-degree output signal is designed to be symmetrical. Accordingly, any offset error due to the parasitic phase delay in the present exemplary embodiment is small. As timing is designed such that the level inversion between the high and low levels of each of the above two signals occurs once in the sampling time, offset errors caused upon the level inversion cancel out each other and hence are small. Furthermore, since the present exemplary embodiment is made up of a minimum required number of circuit components, the absolute phase delays are small. For the above reasons, highly accurate, high-speed phase detection is realized, and automatic filter adjustment which is highly accurate and capable of high-speed operation is realized.

The invention claimed is:

1. An automatic adjustment circuit for automatically adjusting frequency characteristics, comprising:
    a replica made of a circuit block, or a portion thereof, of a circuit to be adjusted; and
    an integrating circuit for using any of an external reference signal or a plurality of external reference signals and an output signal or a plurality of output signals from said replica to which said reference signal or reference signals are input, as a clock signal and input signals, and integrating said input signal in synchronism with said clock signal, wherein said integrating circuit comprises:
    first and second charge pumps for discharging or drawing currents through output terminals thereof depending on high or low levels of signals input thereto;
    first and second switch circuits for short-circuiting or opening input and output terminals thereof depending on high or low levels of signals input to switching terminals thereof;
    an inverting circuit; and
    a capacitor;
    wherein said output terminal of said first charge pump, said output terminal of said second charge pump, and said input terminal of said first switch circuit are connected to each other;
    said capacitor and the input terminal of said second switch circuit are connected parallel to the output terminal of said first switch circuit;
    said inverting circuit has an output terminal connected to the switching terminal of said second switch circuit; and
    said inverting circuit has an input terminal connected to the switching terminal of said first switch circuit.

2. The automatic adjustment circuit according to claim 1, wherein the output signal of said replica has a phase delay which is an integral multiple of 90 degrees with respect to said external reference signal.

3. The automatic adjustment circuit according to claim 1, wherein said replica comprises a second-order biquad circuit.

4. The automatic adjustment circuit according to claim 1, wherein said external reference signal is of a rectangular wave.

5. The automatic adjustment circuit according to claim 1, wherein said integrating circuit includes:
    two input terminals for being supplied with said input signals; and
    a synchronizing clock terminal for being supplied with said clock signal;
    wherein said integrating circuit outputs either one of two types of signals depending on a result of comparison between integral values of said input signals supplied respectively to said input terminals.

6. The automatic adjustment circuit according to claim 1, wherein said integrating circuit includes:
    two input terminals for being supplied with said input signals; and
    a synchronizing clock terminal for being supplied with said clock signal;
    wherein said integrating circuit outputs a signal depending on the difference between integral values of said input signals supplied respectively to said input terminals.

7. The automatic adjustment circuit according to claim 1, wherein said replica comprises a differential circuit for being supplied with a set of two complementary input signals and outputting a set of two complementary output signals.

8. The automatic adjustment circuit according to claim 1, wherein said integrating circuit includes an output terminal connected to an adjusting terminal for adjusting frequency characteristics of said replica.

9. The automatic adjustment circuit according to claim 1, comprising;
a matching circuit connected in series to an output terminal of said replica, for shaping a signal waveform to match the input of said integrating circuit.

10. The automatic adjustment circuit according to claim 1, wherein said matching circuit has a function to convert a sine wave into a rectangular wave.

11. The automatic adjustment circuit according to claim 1, wherein said integrating circuit is supplied with said external reference signal and the output signal of said replica which has a phase delay of 180 degrees with respect to said external reference signal, as said input signals, and is also supplied with the output signal of said replica which has a phase delay of 90 degrees with respect to said external reference signal, as said clock signal.

12. The automatic adjustment circuit according to claim 1, wherein said integrating circuit is supplied with a first external reference signal and a second external reference signal which has a phase delay of 180 degrees with respect to said first external reference signal, as said input signals, and is also supplied with the output signal of said replica which has a phase delay of 90 degrees with respect to said first external reference signal, as said clock signal.

13. The automatic adjustment circuit according to claim 1, wherein said integrating circuit is supplied with the output signal of said replica which has a phase delay of 90 degrees with respect to said external reference signal and the output signal of said replica which has a phase delay of 270 degrees with respect to said external reference signal, as said input signals, and is also supplied with said external reference signal as said clock signal.

14. A filter circuit incorporating an automatic adjustment circuit according to claim 1, wherein an adjusting terminal for adjusting frequency characteristics of said circuit to be adjusted and an adjusting terminal for adjusting frequency characteristics of said replica are connected to each other either directly or with another circuit connected in series or parallel between said adjusting terminals.

\* \* \* \* \*